(12) United States Patent
Jinbo

(10) Patent No.: US 9,952,626 B2
(45) Date of Patent: *Apr. 24, 2018

(54) SEMICONDUCTOR DEVICE

(71) Applicant: Semiconductor Energy Laboratory Co., Ltd., Atsugi-shi, Kanagawa-ken (JP)

(72) Inventor: Yasuhiro Jinbo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/982,079

(22) Filed: Dec. 29, 2015

(65) Prior Publication Data

US 2016/0187930 A1   Jun. 30, 2016

Related U.S. Application Data

(63) Continuation of application No. 14/570,471, filed on Dec. 15, 2014, now Pat. No. 9,229,481.

(30) Foreign Application Priority Data

Dec. 20, 2013 (JP) .................................. 2013-263533

(51) Int. Cl.
*H01J 29/10* (2006.01)
*G06F 1/16* (2006.01)
(Continued)

(52) U.S. Cl.
CPC .......... *G06F 1/1652* (2013.01); *G06F 1/1601* (2013.01); *G06F 1/1677* (2013.01);
(Continued)

(58) Field of Classification Search
CPC ............... G06F 1/1652; G06F 1/13308; G06F 1/133608
(Continued)

(56) References Cited

U.S. PATENT DOCUMENTS 7,311,366 B2   12/2007   Kim et al.
8,319,725 B2   11/2012   Okamoto et al.
(Continued)

FOREIGN PATENT DOCUMENTS

JP   2012-502372       1/2012
JP   2012-190794 A    10/2012

*Primary Examiner* — Vip Patel
(74) *Attorney, Agent, or Firm* — Fish & Richardson P.C.

(57) ABSTRACT

A highly portable semiconductor device and the like providing improved browsability of display. Provided is a semiconductor device including a flexible display panel, a first housing supporting a first region of the display panel, a second housing supporting a second region of the display panel, and a flexible base material firmly attached to the first housing. The display panel can be deformed into an open position where the first and second regions are substantially on the same plane or into a folded position where the first and second regions overlap with each other. The second housing includes a groove portion where the flexible base material can partly slide. Part of the flexible base material is inserted into the groove portion in the open position. The part of the flexible base material which is inserted into the groove portion is at least partly withdrawn in a deformation into the folded position.

40 Claims, 17 Drawing Sheets

(51) Int. Cl.
　　*G06F 1/32*　　　(2006.01)
　　*G09F 9/30*　　　(2006.01)
　　*H01L 27/32*　　(2006.01)
　　*H01L 51/00*　　(2006.01)
　　*H01L 51/52*　　(2006.01)
　　*H04M 1/02*　　(2006.01)

(52) U.S. Cl.
　　CPC ............ *G06F 1/3265* (2013.01); *G09F 9/301* (2013.01); *H01L 27/323* (2013.01); *H01L 27/3244* (2013.01); *H01L 51/0097* (2013.01); *H01L 51/524* (2013.01); *H04M 1/0268* (2013.01); *H01L 2251/5338* (2013.01); *Y02B 60/1242* (2013.01); *Y02E 10/549* (2013.01)

(58) Field of Classification Search
　　USPC .............................. 313/461, 477 R, 498, 511
　　See application file for complete search history.

(56) References Cited

U.S. PATENT DOCUMENTS

| | | | |
|---|---|---|---|
| 8,427,420 | B2 | 4/2013 | Yamazaki et al. |
| 8,803,816 | B2 | 8/2014 | Kilpatrick, II et al. |
| 8,810,508 | B2 | 8/2014 | Okamoto et al. |
| 8,836,611 | B2 | 9/2014 | Kilpatrick, II et al. |
| 8,860,632 | B2 | 10/2014 | Kilpatrick, II et al. |
| 8,860,765 | B2 | 10/2014 | Kilpatrick, II et al. |
| 8,863,038 | B2 | 10/2014 | King et al. |
| 8,866,840 | B2 | 10/2014 | Dahl et al. |
| 2002/0104769 | A1* | 8/2002 | Kim ...................... G06F 1/1601 206/320 |
| 2003/0025118 | A1 | 2/2003 | Yamazaki et al. |
| 2006/0027817 | A1 | 2/2006 | Yamazaki et al. |
| 2006/0163577 | A1 | 7/2006 | Yamazaki et al. |
| 2008/0013265 | A1 | 1/2008 | Kim |
| 2008/0055831 | A1 | 3/2008 | Satoh |
| 2009/0078938 | A1 | 3/2009 | Yamazaki |
| 2009/0302339 | A1 | 12/2009 | Yamazaki et al. |
| 2010/0064536 | A1 | 3/2010 | Caskey et al. |
| 2010/0066643 | A1 | 3/2010 | King et al. |
| 2010/0085382 | A1 | 4/2010 | Lundqvist et al. |
| 2010/0148209 | A1 | 6/2010 | Hatano et al. |
| 2010/0193788 | A1 | 8/2010 | Yamazaki et al. |
| 2011/0133182 | A1 | 6/2011 | Saito et al. |
| 2011/0175101 | A1 | 7/2011 | Hatano et al. |
| 2012/0007090 | A1 | 1/2012 | Yamazaki et al. |
| 2012/0049340 | A1 | 3/2012 | Tsurume et al. |
| 2012/0061664 | A1 | 3/2012 | Yamazaki et al. |
| 2012/0062814 | A1 | 3/2012 | Yamazaki et al. |
| 2012/0217516 | A1 | 8/2012 | Hatano et al. |
| 2012/0264489 | A1* | 10/2012 | Choi .................. H04M 1/0216 455/566 |
| 2012/0273834 | A1 | 11/2012 | Hatano et al. |
| 2012/0326145 | A1 | 12/2012 | Oikawa et al. |
| 2013/0228785 | A1 | 9/2013 | Hatano et al. |
| 2013/0234133 | A1 | 9/2013 | Saito et al. |
| 2013/0240855 | A1 | 9/2013 | Chida et al. |
| 2013/0252089 | A1 | 9/2013 | Kuriki |
| 2013/0300284 | A1 | 11/2013 | Nishido |
| 2013/0300732 | A1 | 11/2013 | Hosoya |
| 2013/0306948 | A1 | 11/2013 | Yamazaki et al. |
| 2013/0314346 | A1 | 11/2013 | Yamazaki et al. |
| 2013/0321373 | A1 | 12/2013 | Yoshizumi |
| 2014/0008668 | A1 | 1/2014 | Hirakata |
| 2014/0017834 | A1 | 1/2014 | Yamazaki et al. |
| 2014/0045283 | A1 | 2/2014 | Hirakata et al. |
| 2014/0065430 | A1 | 3/2014 | Yamazaki et al. |
| 2014/0104508 | A1 | 4/2014 | Yamazaki et al. |
| 2014/0138733 | A1 | 5/2014 | Hatano et al. |
| 2014/0151674 | A1 | 6/2014 | Yamazaki et al. |
| 2014/0234664 | A1 | 8/2014 | Yasumoto et al. |
| 2014/0254111 | A1 | 9/2014 | Yamazaki et al. |
| 2014/0264425 | A1 | 9/2014 | Chida |
| 2014/0273317 | A1 | 9/2014 | Chida |
| 2014/0306260 | A1 | 10/2014 | Yamazaki et al. |
| 2014/0306288 | A1 | 10/2014 | Adachi et al. |
| 2014/0319550 | A1 | 10/2014 | Yamazaki et al. |
| 2014/0321074 | A1 | 10/2014 | Chida et al. |
| 2014/0332150 | A1 | 11/2014 | Hirakata et al. |
| 2014/0339564 | A1 | 11/2014 | Yamazaki et al. |
| 2014/0355195 | A1 | 12/2014 | Kee et al. |
| 2014/0361980 | A1 | 12/2014 | Iwaki et al. |
| 2014/0375660 | A1 | 12/2014 | Tamaki |
| 2015/0009128 | A1 | 1/2015 | Matsumoto |
| 2015/0014681 | A1 | 1/2015 | Yamazaki |
| 2015/0016126 | A1 | 1/2015 | Hirakata et al. |
| 2015/0022515 | A1 | 1/2015 | Ikeda et al. |
| 2015/0022561 | A1 | 1/2015 | Ikeda et al. |
| 2015/0023030 | A1 | 1/2015 | Tsukamoto |
| 2015/0023031 | A1 | 1/2015 | Endo |
| 2015/0028328 | A1 | 1/2015 | Ikeda et al. |
| 2015/0035001 | A1 | 2/2015 | Yamazaki et al. |
| 2015/0035777 | A1 | 2/2015 | Hirakata et al. |
| 2015/0044792 | A1 | 2/2015 | Aoyama et al. |
| 2015/0048349 | A1 | 2/2015 | Kawata et al. |
| 2015/0055286 | A1 | 2/2015 | Eguchi |
| 2015/0059987 | A1 | 3/2015 | Kumakura et al. |
| 2015/0060890 | A1 | 3/2015 | Oikawa et al. |
| 2015/0062525 | A1 | 3/2015 | Hirakata |
| 2015/0062927 | A1 | 3/2015 | Hirakata et al. |
| 2015/0068683 | A1 | 3/2015 | Ohno et al. |
| 2015/0069358 | A1 | 3/2015 | Chida et al. |
| 2015/0069449 | A1 | 3/2015 | Nishido |
| 2015/0075720 | A1 | 3/2015 | Hirakata et al. |
| 2015/0076473 | A1 | 3/2015 | Miyake |
| 2015/0077438 | A1 | 3/2015 | Tamaki et al. |
| 2015/0103023 | A1 | 4/2015 | Iwaki |
| 2015/0123106 | A1 | 5/2015 | Yasumoto et al. |
| 2015/0123896 | A1 | 5/2015 | Tamaki |
| 2015/0138041 | A1 | 5/2015 | Hirakata et al. |
| 2015/0138072 | A1 | 5/2015 | Yamazaki et al. |
| 2015/0138699 | A1 | 5/2015 | Yamazaki |
| 2015/0144920 | A1 | 5/2015 | Yamazaki et al. |
| 2015/0145755 | A1 | 5/2015 | Yamazaki et al. |
| 2015/0146069 | A1 | 5/2015 | Yamazaki et al. |
| 2015/0146352 | A1 | 5/2015 | Yanagisawa et al. |
| 2015/0153861 | A1 | 6/2015 | Yamazaki et al. |
| 2015/0153862 | A1 | 6/2015 | Nakamura et al. |
| 2015/0154730 | A1 | 6/2015 | Hirakata et al. |
| 2015/0162569 | A1 | 6/2015 | Chida |
| 2015/0179717 | A1 | 6/2015 | Kawata |
| 2015/0194566 | A1 | 7/2015 | Yamazaki et al. |
| 2015/0255348 | A1 | 9/2015 | Sugiyama et al. |
| 2016/0035797 | A1 | 2/2016 | Yamazaki et al. |
| 2016/0056224 | A1 | 2/2016 | Hirakata |
| 2016/0072021 | A1 | 3/2016 | Chida |
| 2016/0111550 | A1 | 4/2016 | Adachi et al. |
| 2016/0218118 | A1 | 7/2016 | Yamazaki et al. |
| 2016/0226019 | A1 | 8/2016 | Yamazaki et al. |
| 2016/0240822 | A1 | 8/2016 | Chida et al. |
| 2016/0243812 | A1 | 8/2016 | Kumakura et al. |
| 2016/0268360 | A1 | 9/2016 | Ikeda et al. |
| 2016/0269515 | A1 | 9/2016 | Yamazaki et al. |
| 2016/0273739 | A1 | 9/2016 | Endo |
| 2016/0307969 | A1 | 10/2016 | Eguchi |
| 2016/0307982 | A1 | 10/2016 | Hatano et al. |
| 2016/0336538 | A1 | 11/2016 | Yamazaki et al. |
| 2016/0343777 | A1 | 11/2016 | Hirakata et al. |
| 2016/0343781 | A1 | 11/2016 | Kawata et al. |
| 2017/0006716 | A1 | 1/2017 | Hirakata et al. |

\* cited by examiner

SEMICONDUCTOR DEVICE

CROSS-REFERENCE TO RELATED APPLICATIONS

This application is a continuation of U.S. application Ser. No. 14/570,471, filed Dec. 15, 2014, now allowed, which claims the benefit of a foreign priority application filed in Japan as Serial No. 2013-263533 on Dec. 20, 2013, both of which are incorporated by reference.

BACKGROUND OF THE INVENTION

1. Field of the Invention

The present invention relates to an object, a method, or a manufacturing apparatus. In addition, the present invention relates to a process, a machine, manufacture, or a composition of matter. In particular, one embodiment of the present invention relates to a semiconductor device, a display device, a light-emitting device, a lighting device, driving methods thereof, or manufacturing methods thereof. In particular, one embodiment of the present invention relates to an electronic device, an information processor, and a communication information device, each of which has a display device, or manufacturing methods thereof.

2. Description of the Related Art

Portable information processors such as smartphones, tablets, and phablets are under active development. For example, an electronic device using a flexible display panel has been known (Patent Document 1). In addition, a multi-panel electronic device has been known (Patent Document 2).

REFERENCES

Patent Documents

[Patent Document 1] Japanese Published Patent Application No. 2012-190794
[Patent Document 2] Japanese Published Patent Application No. 2012-502372

SUMMARY OF THE INVENTION

Enlarged display regions of semiconductor devices can display a larger amount of information, leading to improved browsability of display. However, in applications of mobile devices and the like, an enlargement of display regions entails a reduction in portability. Thus, browsability of display and portability are difficult to improve at the same time.

An object of one embodiment of the present invention is to provide a highly portable semiconductor device and the like. Another object of one embodiment of the present invention is to provide a semiconductor device and the like which provide improved browsability of display. Another object is to provide a highly reliable semiconductor device and the like. Another object is to provide a highly portable semiconductor device and the like which provide improved browsability of display. Another object is to provide a novel semiconductor device and the like.

Note that the descriptions of these objects do not disturb the existence of other objects. In one embodiment of the present invention, there is no need to achieve all the objects. Objects other than the above objects will be apparent from and can be derived from the description of the specification and the like.

One embodiment of the present invention is a semiconductor device including a flexible display panel, a first housing supporting a first region of the display panel, a second housing supporting a second region of the display panel, and a flexible base material firmly attached to the first housing. The display panel is capable of being deformed into an open position in which the first region and the second region are substantially on the same plane or into a folded position in which the first region and the second region overlap with each other. The second housing includes a groove portion in which part of the flexible base material can slide. Part of the flexible base material is inserted into the groove portion in the open position. The part of the flexible base material which is inserted into the groove portion is at least partly withdrawn when the display panel is deformed into the folded position.

In the above semiconductor device, the flexible base material may be bent to have a curved surface in the folded position.

Another embodiment of the present invention is a semiconductor device including a flexible display panel, a first housing supporting a first region of the display panel, a second housing supporting a second region of the display panel, a first flexible base material firmly attached to the first housing, and a second flexible base material firmly attached to the first housing. The display panel is capable of being deformed into an open position in which the first region and the second region are substantially on the same plane or into a folded position in which the first region and the second region overlap with each other. The first flexible base material is provided on a display surface side of the display panel. The second flexible base material is provided on a side opposite the display surface side of the display panel. The second housing includes a first groove portion in which part of the first flexible base material can slide and a second groove portion in which part of the second flexible base material can slide. Part of the first flexible base material is inserted into the first groove portion and part of the second flexible base material is inserted into the second groove portion in the open position. The part of the first flexible base material which is inserted into the first groove portion is at least partly withdrawn and the part of the second flexible base material which is inserted into the second groove portion is at least partly withdrawn when the display panel is deformed into the folded position.

Another embodiment of the present invention is a semiconductor device including a flexible display panel, a first housing supporting a first region of the display panel, a second housing supporting a second region of the display panel, a first flexible base material firmly attached to the first housing, and a second flexible base material firmly attached to the second housing. The display panel is capable of being deformed into an open position in which the first region and the second region are substantially on the same plane or into a folded position in which the first region and the second region overlap with each other. The first flexible base material is provided on a display surface side of the display panel. The second flexible base material is provided on a side opposite the display surface side of the display panel. The first housing includes a first groove portion in which part of the second flexible base material can slide and the second housing includes a second groove portion in which part of the first flexible base material can slide. Part of the first flexible base material is inserted into the second groove portion and part of the second flexible base material is inserted into the first groove portion in the open position. The part of the first flexible base material which is inserted into the second groove portion is at least partly withdrawn and the part of the second flexible base material which is inserted into the first groove portion is at least partly withdrawn when the display panel is deformed into the folded position.

In the above semiconductor device, the first flexible base material and the second flexible base material may each be bent to have a curved surface in the folded position.

According to one embodiment of the present invention, a highly portable semiconductor device and the like can be provided. According to one embodiment of the present invention, a semiconductor device and the like which provide improved browsability of display can be provided. According to one embodiment of the present invention, a highly reliable semiconductor device and the like can be provided. According to one embodiment of the present invention, a highly portable semiconductor device and the like which provides improved browsability of display can be provided. According to one embodiment of the present invention, a novel semiconductor device and the like can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 4A to 4C2 are a perspective view and cross-sectional views of structure examples of a semiconductor device of one embodiment of the present invention;

DETAILED DESCRIPTION OF THE INVENTION

Figure 1A:
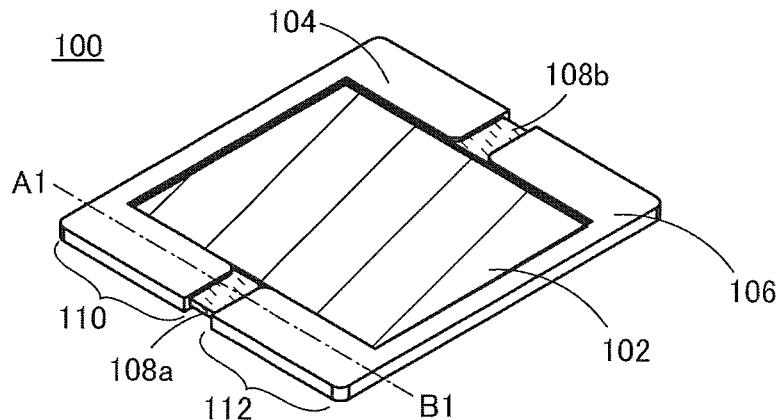
FIGS. 1A to 1C are perspective views of a structure example of a semiconductor device of one embodiment of the present invention.

Hereinafter, embodiments of the present invention will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such a scale.

In this specification and the like, ordinal numbers such as "first", "second", and the like are used in order to avoid confusion among components, and the terms do not limit the components numerically. Therefore, for example, description can be made even when "first" is replaced with "second" or "third", as appropriate.

The term such as "over" or "below" in this specification and the like does not necessarily mean that a component is placed "directly on" or "directly under" another component. For example, the expression "a second layer over a first layer" does not exclude the case where a component is placed between the first layer and the second layer. The same applies to the term "below".

Embodiment 1

In this embodiment, a semiconductor device of one embodiment of the present invention is described with reference to FIGS. 1A to 1C, FIGS. 2A to 2C, FIGS. 3A and 3B, FIGS. 4A to 4C2, and FIG. 5. The semiconductor device of one embodiment of the present invention includes a flexible display panel supported by a plurality of housings. The display panel can be deformed into an open position in which regions supported by different housings are substantially on the same plane or into a folded position in which the regions supported by the different housings overlap with each other. A description is made below of an example of a semiconductor device that includes a flexible display panel supported by two housings and can be deformed into a position where the semiconductor device is opened (open position) or into a position where the semiconductor device is folded in two (folded position) by bending the display panel between the two housings.

Figure 1B:
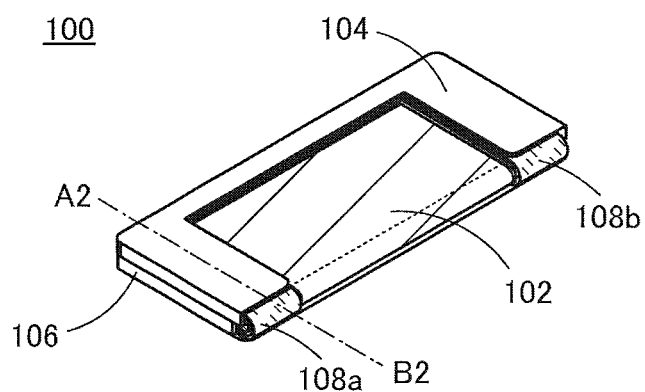
Figure 1C:
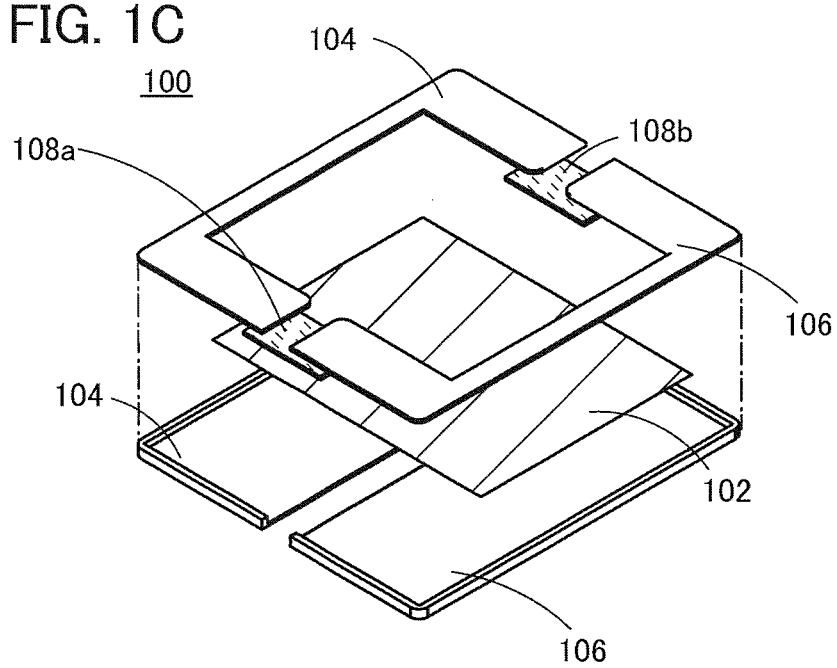

FIGS. 1A to 1C illustrate perspective views of a semiconductor device 100 of one embodiment of the present invention. The semiconductor device 100 includes a flexible display panel 102, a housing 104 supporting a region 110 of the display panel 102, a housing 106 supporting a region 112 of the display panel 102, and a pair of flexible base materials 108*a* and 108*b* provided between the housings 104 and 106. One end of each of the pair of flexible base materials 108*a* and 108*b* is firmly attached to the housing 104.

FIG. 1A illustrates an open position in which the region 110 supported by the housing 104 and the region 112 supported by the housing 106 are substantially on the same plane in the display panel 102. In the semiconductor device 100 in the open position, a groove portion is provided on a side of the housing 106 which faces the housing 104. The other end of each of the pair of flexible base materials 108*a* and 108*b* firmly attached to the housing 104 is placed in the groove portion of the housing 106.

FIG. 1B illustrates a folded position in which the region 110 and the region 112 of the display panel 102 overlap with each other. In the folded position, the display panel 102 supported by the housings 104 and 106 is bent so as to have a curved surface in a region between the housings 104 and 106. In the semiconductor device 100 of this embodiment, the groove portion provided in one of the adjacent housings serves as a slide base, and the flexible base materials 108*a* and 108*b* provided between the adjacent housings slide in the groove portion. Thus, in the folded position illustrated in FIG. 1B, at least part of the flexible base materials 108*a* and 108*b* placed in the groove portion of the housing 106 in the open position is withdrawn, and the flexible base materials 108*a* and 108*b* are bent to have a curved surface, like the display panel 102. The semiconductor device 100 in the folded position can be highly portable, and a seamless large display region of the semiconductor device in the open position can provide improved browsability of display.

FIG. 1C is a development view illustrating components of the semiconductor device 100.

Figure 2A:
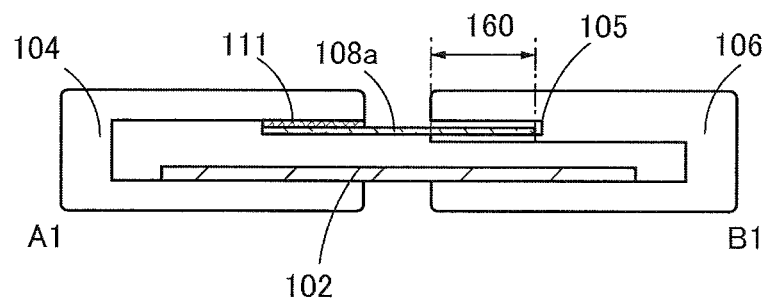
FIGS. 2A to 2C are cross-sectional views of structure examples of a semiconductor device of one embodiment of the present invention.
Figure 2B:
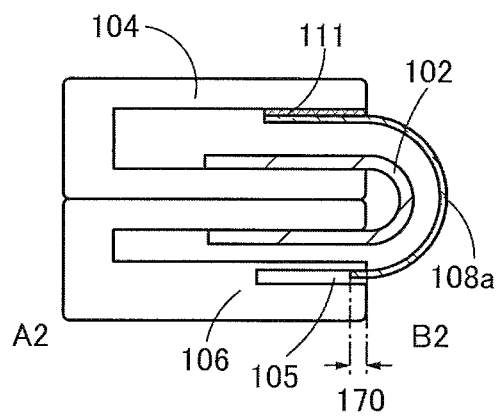

FIG. 2A is a cross sectional view of the semiconductor device 100 in FIG. 1A taken along the line A1-B1. FIG. 2B is a cross sectional view of the semiconductor device 100 in FIG. 1B taken along the line A2-B2.

As illustrated in FIG. 2A, in the open position, a region 160 of the flexible base material 108*a* firmly attached to the housing 104 with a bonding layer 111 is inserted into the groove portion 105 of the housing 106. The length of the region 160 in the groove portion 105 can be determined as appropriate depending on the radius of curvature of the display panel 102 in the folded position. Note that in FIGS. 2A and 2B, the flexible base material 108*a* is provided to face a display surface or a surface opposite the display surface (also referred to as a back surface) of the display panel 102 in the housing 104, but one embodiment of the present invention is not limited to this. For example, the flexible base material 108*a* may be provided on the outside of the housing 104.

As illustrated in FIG. 2B, in the folded position, the housings 104 and 106 overlap with each other so that one surface of the housing 104 and one surface of the housing 106 are in contact with each other. The length of a region 170 of the flexible base material 108*a* placed in the groove portion 105 of the housing 106 in the folded position is shorter than the length of the region 160 of the flexible base material 108*a* placed in the groove portion 105 of the housing 106 in the open position. In other words, when the semiconductor device 100 is deformed from the open position into the folded position, part of the flexible base material 108*a* inserted into the groove portion 105 is withdrawn from the groove portion 105. Furthermore, the display panel 102 in the folded position has a region that does not overlap with the housing 104 or 106 (a region projecting from the housings 104 and 106 in the cross-sectional view) and has a curved surface in this region. Also the flexible base material 108*a* in the folded position has a region that does not overlap with the housing 104 or 106 (a region projecting from the housings 104 and 106 in the cross-sectional view) and has a curved surface in this region. The curved surface of the flexible base material 108*a* is on the outside of the curved surface of the display panel 102. In other words, in the folded position, the curved surface of the display panel 102 is interposed between the curved surface of the flexible base material 108*a* and the side surfaces of the housings 104 and 106 which face the curved surface of the flexible base material 108*a*.

Because the curved surface of the flexible base material 108*a* is on the outside of the curved surface of the display panel 102 in the folded position and/or in a deformation between the open position and the folded position, a load such as stress on and damage to a curved region of the display panel 102 can be reduced.

Note that the display panel 102 is preferably provided by being firmly attached to at least one of the housings 104 and 106. In the example in FIGS. 2A to 2C, the display panel 102 is firmly attached to the housing 104, not to the housing 106. In such a structure, the display panel 102 can slide in the housing 106 when the semiconductor device 100 is being folded; accordingly, a load on the curved surface of the display panel 102 can further be reduced.

Figure 2C:
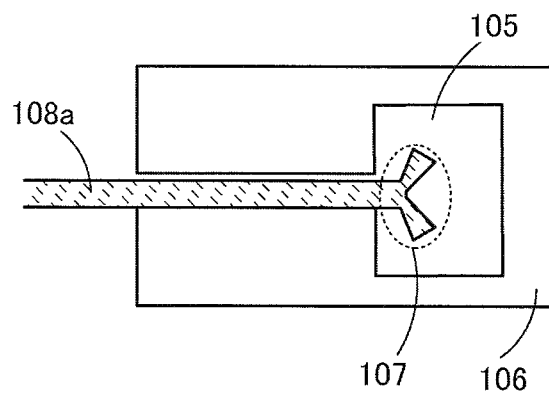
Figure 3A:
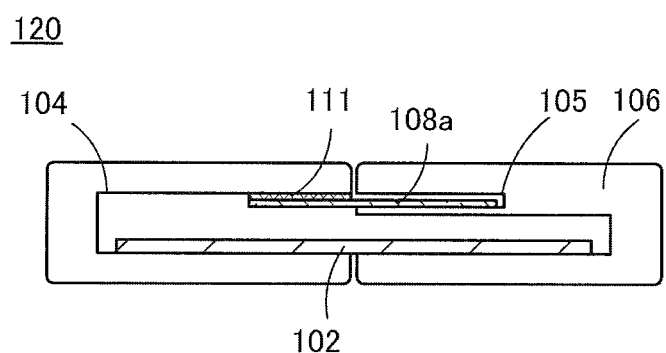
FIGS. 3A and 3B are a cross-sectional view and a perspective view of a structure example of a semiconductor device of one embodiment of the present invention.
Figure 3B:
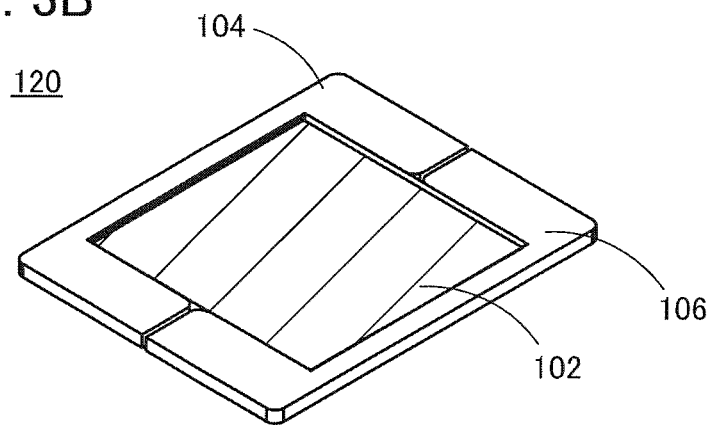

The structure of the flexible base material 108*a* is not limited to that in FIGS. 1A to 1C and FIGS. 2A and 2B. For example, as illustrated in FIG. 2C, an end portion of the flexible base material 108*a* may have an anchor portion 107. The anchor portion 107 at the end portion of the flexible base material 108*a* can prevent the flexible base material 108*a* from being entirely withdrawn from the groove portion 105 of the housing 106 in a deformation from an open position into a folded position (or from a folded position into an open position). Note that when the flexible base material 108*a* has the anchor portion 107 as illustrated in FIG. 2C, the groove portion 105 has at least two different heights. Specifically, the height of the groove portion 105 in a region through which the flexible base material 108*a* is withdrawn to the outside of the housing 106 is higher than the height of the region of the flexible base material 108*a* except the anchor portion 107 and is lower than the height of the anchor portion 107. The height of the groove portion 105 in the region in which the anchor portion 107 is located is higher than the height of the anchor portion 107. In another structure, the height of the groove portion 105 may be gradually increased as it is farther from the region through which the flexible base material 108*a* is withdrawn from the housing 106. Note that the shape of the anchor portion 107 is not limited to the structure in FIG. 2C. In addition, it is not necessary that the anchor portion 107 be flexible.

In a folded position, a region hidden by folding the semiconductor device may be a non-display region in the display panel 102. For example, when the region 110 supported by the housing 104 is a display region and the region 112 supported by the housing 106 is a non-display region in the display panel 102, power consumed by a region (region 112 here) invisible to users can be reduced. Note that when the region 112 is a non-display region, the curved region (region having a curved surface) in the display panel 102 may be either a display region or a non-display region; in the case of the display region, this region and the region 110 may operate separately or may be a continuous display region.

Components of the semiconductor device 100 are detailed below.

The housings 104 and 106 are provided on at least one of the display surface side or back surface side of the display panel 102 as long as they can support the display panel 102. In the example in FIGS. 1A to 1C and FIGS. 2A and 2B, the peripheral portion (the region except the display region) of the display surface side of the display panel 102 and the back surface side thereof are supported by the housings. The use of such housings supporting both sides of the display panel 102 increases mechanical strength, which prevents the semiconductor device 100 from being damaged.

Each housing may have rigidity or may be formed with a member capable of being deformed by force of bending, twisting, or the like. Each housing can be formed with a material having lower flexibility than at least the display panel 102, and an elastic body such as hard rubber may be used for a skeleton of the housing. Besides, as a material forming each housing, plastic, a metal such as aluminum, an alloy such as stainless steel or a titanium alloy, rubber such as silicone rubber, or the like can be used.

When regions of the housings 104 and 106 which are on the display surface side do not overlap with the display region of the display panel 102, a material that does not transmit light may be used for each housing. When the regions on the display surface side overlap with at least part of the display region of the display panel 102, a material that transmits light from the display panel 102 is preferably used for each housing. For regions on the side opposite the display surface, a material that does not transmit light may be used.

The housing 104 and/or the housing 106 can store a circuit, an electronic component, a battery and the like inside. The housing 104 and/or the housing 106 may be formed using a metal, a resin, a rubber, or a combination thereof to have a function of protecting the display panel 102, or a circuit or an electronic component stored inside, from the impact of hitting or drop.

In the example in FIGS. 2A to 2C, the housings 104 and 106 are formed to have a space for holding the display panel 102, but one embodiment of the present invention is not limited to this example. The housing 104 and/or the housing 106 may be separated in the direction perpendicular or parallel to the display surface of the display panel 102. When the housing 104 and/or the housing 106 is/are separated in the direction perpendicular or parallel to the display surface of the display panel 102, members of each housing and the display panel 102 can be fixed to each other with a fixing means such as an adhesive or a screw. Although not illustrated, a circuit or an electronic component such as a control portion, a power supply portion, a storage battery, or an antenna may be stored in the space of the housing 104 and/or the housing 106. A flexible printed circuit (FPC) substrate may be used for connection between the circuit or electronic component and the display panel 102.

The housing 104 and/or the housing 106 may be directly attached to the display panel 102 with an adhesive or the like. Alternatively, a flexible substrate may be provided between the display panel 102 and the housing(s); the flexible substrate may have a function as a member for protecting the display panel 102 or a function of leading a wire, for example. Components may be fixed with, for example, a screw that penetrates two or more of the housing(s) and the display panel 102 or a pin or a clip that holds them.

Figure 16A:
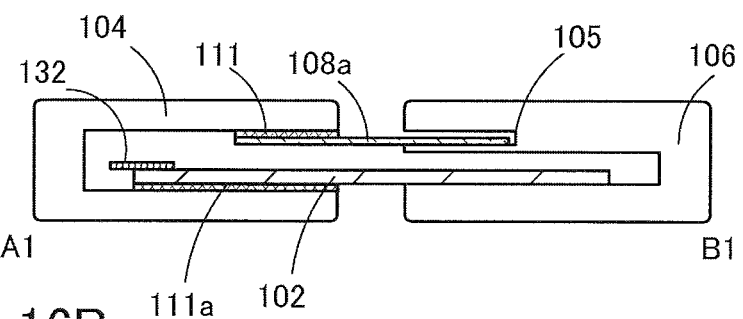
FIGS. 16A and 16B are cross-sectional views of a structure example of a semiconductor device of one embodiment of the present invention.
Figure 16B:
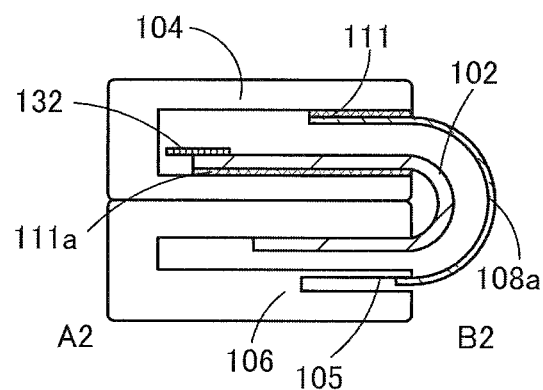

The FPC, which is connected to the display panel 102 when one of the housings is firmly attached to the display panel 102, is preferably provided in a region where the housing is firmly attached to the display panel 102. An example of a semiconductor device having such a structure is illustrated in FIGS. 16A and 16B. In FIGS. 16A and 16B, the display panel 102 is firmly attached to the housing 104 with a bonding layer 111a, and an FPC 132 is provided so as to overlap with the bonding layer 111a with the display panel 102 interposed therebetween. In this structure, a deformation from the open position (FIG. 16A) into the folded position (FIG. 16B) or from the folded position into the open position does not shift a connection portion of the display panel 102, which is connected to the FPC 132, and consequently is less likely to cause a fault such as peeling of the connection portion. Note that the connection between the display panel 102 and the FPC 132 is not limited to the structure in FIGS. 16A and 16B.

The thicknesses of the plurality of housings may be almost the same or different from each other. It is preferable that the thicknesses of two or more housings, preferably the thicknesses of all the housings be almost the same, in which case horizontality of the display surface of the semiconductor device 100 in the open position can be held easily. In addition, if the display panel 102 is placed substantially at the center portion of the semiconductor device 100 along thickness direction, stress applied to the display panel 102 by curving the display panel 102 so that the semiconductor device 100 is folded can be minimized.

The thickness of the housing 106 is partly larger than the thickness of the housing 104 by the thickness of the groove portion 105 for slide of the flexible base material 108a in FIGS. 2A to 2C, but one embodiment of the present invention is not limited to this case. One of the plurality of housings can be used as a main body having a relatively large thickness in which all or most of the above electronic components are collectively provided, with the other housing(s) having a smaller thickness used as a member simply for supporting the display panel 102.

As the display panel 102, a flexible panel having at least a display region can be used. As a display element included in the display panel 102, a light-emitting element, a liquid crystal element, an electrophoretic element, or the like can be used as appropriate.

Protective layers are preferably provided in the peripheral portion (the region except the display region) of the display surface side of the display panel 102 and in a region supporting the back surface side thereof; the protective layer in the region can further increase the mechanical strength of a curved portion. If provided, the protective layer is provided at least in a region which is the curved region between the two housings. In such a case, the protective layer can selectively be provided, for example, in a region in which the flexible base materials 108a and 108b overlap with the display panel 102 in the open position. Note that when a member that transmits light is used for the protective layer, the protective layer that transmits light can be provided also in a region overlapping with the display region of the display panel 102. Alternatively, when a member that blocks light is used for the protective layer, the protective layer can be provided in a region covering a wire, a driver circuit, or the like at an end portion of the display panel 102, for example. In this case, the wire or the driver circuit can not only be physically protected but also be prevented from deteriorating because the wire or the driver circuit is shielded from light. Furthermore, the wire, the driver circuit, or the like can be prevented from being viewed in which case visual pleasure of the semiconductor device itself is impeded.

For example, plastic, rubber, a metal, an alloy, or the like can be used for the protective layer. Plastic, rubber, a titanium alloy, or the like is preferably used for the protective layer or the housing, in which case the semiconductor device can be lightweight and less likely to be broken.

The protective layer and the housing are preferably formed using a material with high toughness, in which case a semiconductor device with high impact resistance that is less likely to be broken can be achieved. For example, use of an organic resin, a thin metal material, or a thin alloy material enables the semiconductor device to be lightweight and less likely to be broken. For a similar reason, also a substrate of the display panel 102 is preferably formed using a material with high toughness.

For the flexible base materials 108a and 108b, a material that can be curved with a radius of curvature greater than or equal to 1 mm and less than or equal to 100 mm in the folded position can be used. Specifically, for example, plastic, rubber, a metal, an alloy, or the like can be used. Note that when the flexible base materials 108a and 108b overlap with the display region, a material that transmits at least light from the display panel 102 needs to be used for the flexible base materials 108a and 108b. When the flexible base materials 108a and 108b do not overlap with the display region, for example, by being provided on the back surface side or periphery of the display surface, it does not matter whether the flexible base materials 108a and 108b transmit light or not. When formed using a material that transmits light or provided on the back surface side of the display panel 102, the flexible base materials are not necessarily a pair of separated members and may be a continuous member.

The flexibility of the display panel 102 is preferably high to easily fold the semiconductor device. On the other hand, excessively increased flexibility of the display panel 102 prevents a support substrate used for the display panel 102 from sufficiently dispersing stress when the display panel 102 is being folded; this might allow a crack in the curved region of the display panel 102 or the like to render the semiconductor device less reliable. However, in the semiconductor device of one embodiment of the present invention, stress applied to the curved region of the display panel 102 when the semiconductor device is being folded can be dispersed by the flexible base materials on the outside of the display panel 102. Hence, the display panel 102 can be less likely to reduce its reliability even with its high flexibility. Preferably, the flexible base materials 108a and 108b are less flexible than the display panel 102. The base materials that are flexible but less flexible than the display panel 102 on the outside of the display panel 102 enables manufacture of a semiconductor device that is easy to fold and has improved strength and high reliability when folded.

Note that the flexible base materials 108a and 108b may include a sensor for determining whether the display panel 102 is curved or not. For example, the sensor can be formed of, for example, a switch, a MEMS pressure sensor, a pressure sensor, or the like. Alternatively, a metal material may be used for the flexible base materials 108a and 108b with a sensor that detects the metal material provided in the display panel 102 so that the open or folded position of the semiconductor device can be determined.

As the bonding layer 111 which firmly attaches the housing 104 to the flexible base materials 108a and 108b, any of a variety of adhesives can be used. For example, a resin that is curable at room temperature such as a two-component-mixture-type resin, a light-curable resin, a thermosetting resin, or the like can be used. Alternatively, a sheet-like adhesive may be used. Note that the bonding layer is not necessarily provided to thinly attach the housing 104 to the flexible base materials 108a and 108b, and for example, a screw that penetrates the flexible base materials 108a and 108b, a pin or a clip that holds them, or the like may be used. Alternatively, the flexible base materials may be firmly attached by being inserted into a housing in a step of processing the housing.

The semiconductor device 100 of this embodiment can be deformed into an open position or a folded position while reducing a load such as stress on the curved region (region having a curved surface) of the display panel 102. This enhances the durability of a folded region of the display panel 102 and makes the semiconductor device highly reliable. Furthermore, because the flexible base materials 108a and 108b function auxiliary when the semiconductor device 100 is being folded, the semiconductor device 100 can be folded with high operability even using a member with high toughness as the display panel 102. Therefore the display panel 102 provided with, for example, a film for protecting the display region or the like can be applied in the semiconductor device 100, which can make the semiconductor device more reliable.

The two housings adjacent to each other can be placed close to each other when a pair of flexible base materials is provided between the housings and slide. For example, as in a semiconductor device 120 illustrated in FIGS. 3A and 3B, the housings 104 and 106 may be placed close to or in contact with each other.

Figure 14:
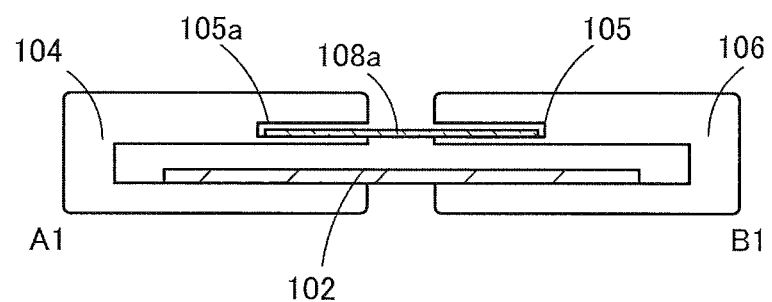
FIG. 14 is a cross-sectional view of a structure example of a semiconductor device of one embodiment of the present invention.

Although the groove portion 105 is provided in one of the adjacent housings in FIGS. 2A to 2C and FIGS. 3A and 3B, one embodiment of the present invention is not limited to these examples and a groove portion may be provided in each of the adjacent housings. For example, in a structure in FIG. 14, a groove portion 105a is provided in the housing 104 in addition to the components illustrated in FIGS. 2A to 2C, so that both of the housings 104 and 106 have the groove portions. As illustrated in FIG. 14, providing the groove portions 105a and 105 in the adjacent housing 104 and 106 respectively makes it easy to render the thicknesses of the housings almost the same. As described above, it is preferable that the thicknesses of the plurality of the housings used for the semiconductor device be almost the same, in which case horizontality of the display surface of the semiconductor device in the open position can be held easily. Note that although FIG. 14 shows the case where the groove portions are provided in both of the adjacent housings in the structure in FIGS. 2A to 2C, a plurality of groove portions can be provided in any of the other drawings disclosed in this specification.

Figure 4A:
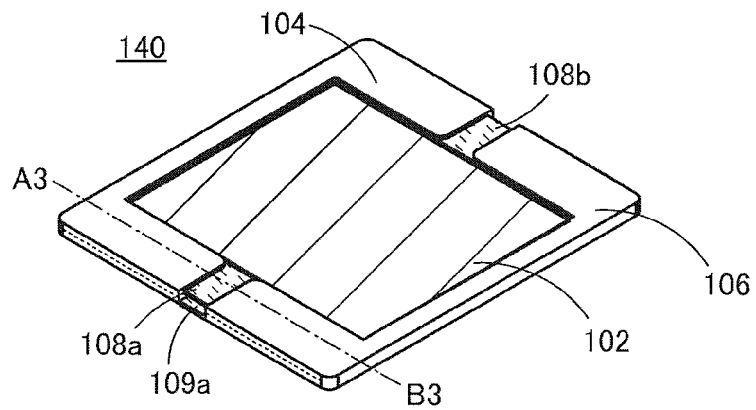
Figure 4B:
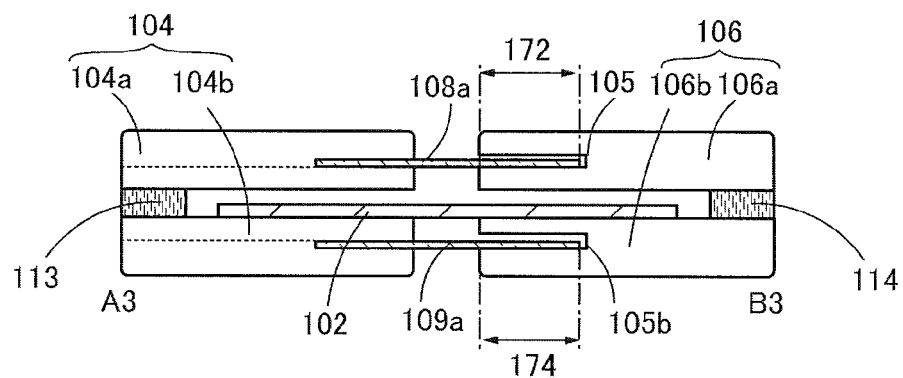
Figure 4B:
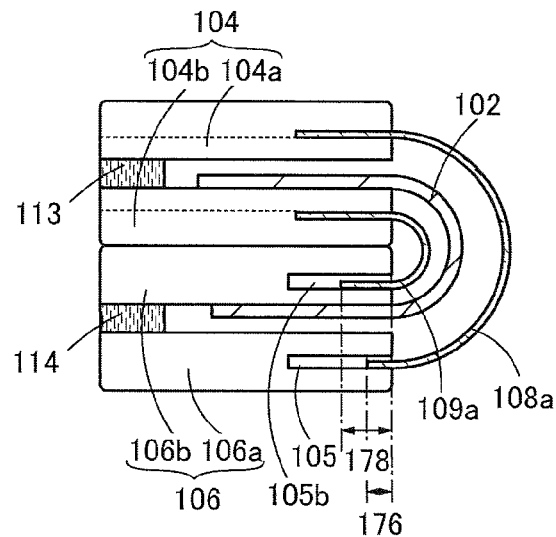
Figure 4B:
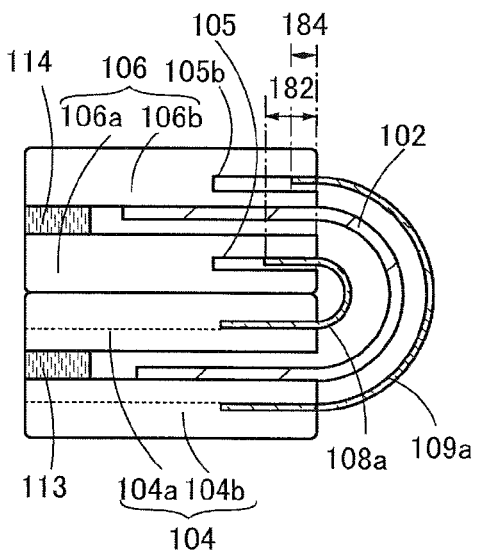

Furthermore, a flexible base material may be provided on each of the display surface side and back surface side of the display panel 102, as illustrated in FIGS. 4A to 4C2. FIG. 4A is a perspective view of a semiconductor device 140 in an open position, and FIG. 4B is a cross-sectional view of FIG. 4A taken along the line A3-B3. FIGS. 4C1 and 4C2 are each a cross-sectional view of the semiconductor device 140 in a folded position.

The semiconductor device 140 illustrated in FIGS. 4A to 4C2 includes, between the housings 104 and 106, the flexible base materials 108a and 108b on the display surface side of the display panel 102 and includes a flexible base material 109a on the back surface side of the display panel 102. The flexible base material 109a provided on the back surface side of the display panel 102 may be a pair of base materials as those on the display surface side or may be a continuous base material extending over at least a region overlapping with the display panel 102. When the flexible base materials 108a and 108b transmit light, the flexible base materials 108a and 108b may be provided so as to overlap with the display region of the display panel 102. When the base materials do not transmit light, the base materials are each preferably separated into a pair of base materials so as to overlap only with a region except the display region.

In the open position, as illustrated in the cross-sectional view in FIG. 4B, a region 172 of the flexible base material 108a firmly attached to a housing 104a is located in the groove portion 105 of the housing 106a, and a region 174 of the flexible base material 109a firmly attached to a housing 104b is located in the groove portion 105b of a housing 106b.

In the example in FIGS. 4A to 4C2, the housing 104 is separated into the housings 104a and 104b in the direction perpendicular to the display surface of the display panel 102 and the housings 104a and 104b are firmly attached to each other with a bonding layer 113; the housing 106 is separated into the housings 106a and 106b in the direction perpendicular to the display surface of the display panel 102 and the housings 106a and 106b are firmly attached to each other with a bonding layer 114. Note that a screw, a pin, a clip or the like may be used instead of the bonding layer 113 or 114.

In the example in FIGS. 4A to 4C2, the flexible base materials 108a and 108b are each firmly attached by being inserted into the housing 104 (specifically, the housing 104a or 104b), without the bonding layer 111.

FIGS. 4C1 and 4C2 each illustrate the semiconductor device 140 in a folded position. Since the flexible base material 108a, 108b, or 109a are provided on both the display surface side and back surface side of the display panel 102, the semiconductor device 140 can be folded so that the display surface of the display panel 102 is placed inward (referred to as inwardly bent) and the semiconductor device 140 can be folded so that the display surface is placed outward (referred to as outwardly bent).

In FIG. 4C1, the semiconductor device 140 is folded so that the display surface faces outward. In the folded position, the flexible base materials 108a and 109a placed in the groove portions 105 and 105b respectively are each withdrawn as described above. When the semiconductor device 140 is outwardly bent, the flexible base material 108a is located on the outside of the display panel 102. In this case, the length of a region 176 of the flexible base material 108a in the groove portion 105 is shorter than the length of a region 178 of the flexible base material 109a in the groove portion 105b.

In FIG. 4C2, the semiconductor device 140 is folded so that the display surface faces inward. When the semiconductor device 140 is inwardly bent, the flexible base material 108a is located on the inside of the display panel 102. In this case, the length of a region 182 of the flexible base material 108a in the groove portion 105 is longer than the length of a region 184 of the flexible base material 109a in the groove portion 105b.

The semiconductor device capable of being outwardly bent can provide a variety of display modes. In addition, the semiconductor device capable of being inwardly bent can reduce damage or dirt on the display surface when carried, for example, which is preferable when the semiconductor device is carried in a pocket of clothes or a bag.

Figure 5:
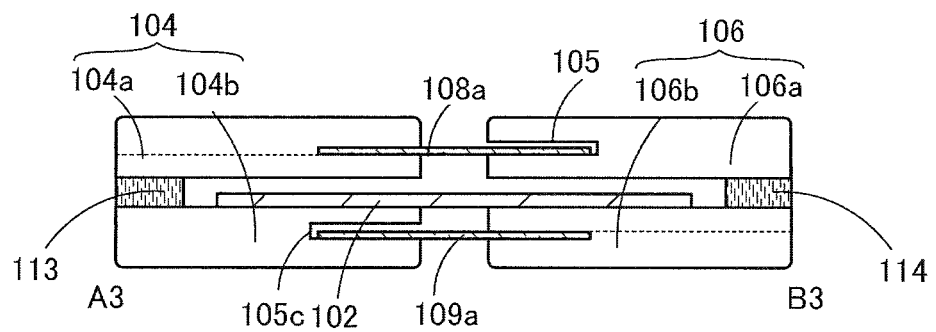
FIG. 5 is a cross-sectional view of a structure example of a semiconductor device of one embodiment of the present invention.

The flexible base materials are firmly attached to the housing 104 and the groove portions in which the flexible base materials slide are provided in the housing 106 in FIGS. 4A to 4C2, but one embodiment of the present invention is not limited to this example. For example, the following structure illustrated in FIG. 5 is possible: the flexible base material 108a on one surface (e.g., display surface) side of the display panel 102 is firmly attached to the housing 104a, and slides in the groove portion 105 provided in the housing 106a, while the flexible base material 109a on the other surface (e.g., back surface) side of the display panel 102 is firmly attached to the housing 106b, and slides in a groove portion 105c provided in the housing 104b.

Figure 15A:
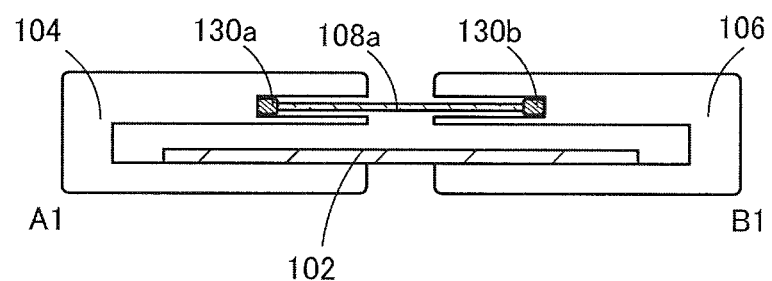
FIGS. 15A to 15C are cross-sectional views of structure examples of a semiconductor device of one embodiment of the present invention.
Figure 15B:
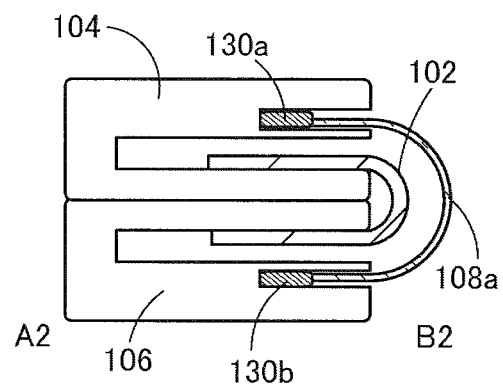
Figure 15C:
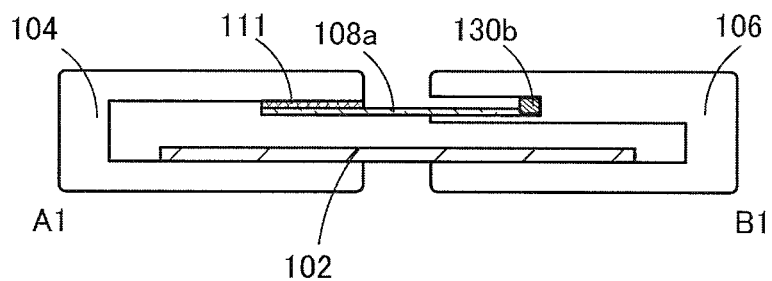

The flexible base material is firmly attached to one of the adjacent housings and is not firmly attached to the other thereof in the above structure, but one embodiment of the present invention is not limited to this structure. A region where the flexible base material is firmly attached to both of the adjacent housings may be present, and a structure example of a semiconductor device in this case is illustrated in FIG. 15A. FIG. 15A illustrates the semiconductor device in an open position, where the flexible base material 108a and the housing 104 are bonded with an elastic body 130a and the flexible base material 108a and the housing 106 are bonded with an elastic body 130b. When such a semiconductor device is folded, the elastic bodies 130a and 130b extend as illustrated in FIG. 15B and can reduce concentration of stress in the curved region of the display panel 102. Thus the semiconductor device can be folded with high operability. Examples of the elastic bodies are a spring, a rubber, an organic resin, and the like. Although FIGS. 15A and 15B illustrate the example in which the elastic bodies are provided in addition to the components illustrated in FIG. 14, the elastic bodies can be applied in the structure illustrated in any of the other drawings. For example, in FIG. 15C, the elastic body 130b is provided in the semiconductor device illustrated in FIG. 2A.

Figure 17A:
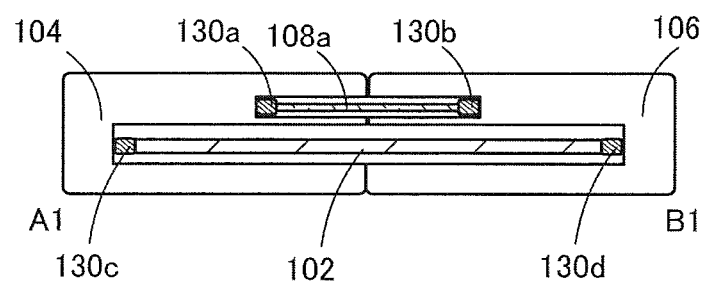
FIGS. 17A and 17B are cross-sectional views of a structure example of a semiconductor device of one embodiment of the present invention.
Figure 17B:
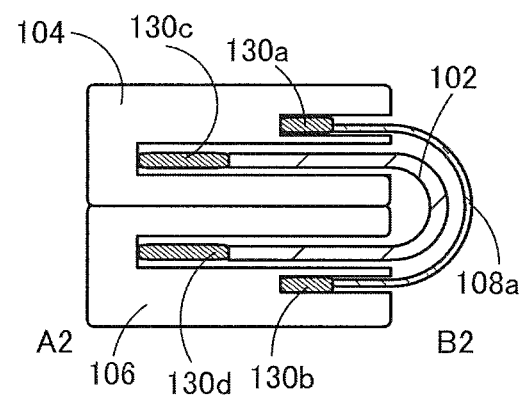

The display panel 102 may be bonded to a housing with an elastic body interposed therebetween. For example, FIG. 17A illustrates a semiconductor device in an open position, in which the display panel 102 is bonded to the housing 104 with an elastic body 130c interposed therebetween and bonded to the housing 106 with an elastic body 130d interposed therebetween. FIG. 17B illustrates the semiconductor device illustrated in FIG. 17A which is in a folded position. The elastic bodies 130c and 130d extend as illustrated in FIG. 17B, and thus the semiconductor device can be folded with high operability.

The semiconductor device includes two housings, the housings 104 and 106, as housings supporting the display panel 102 and can be folded in two in the above structures, but one embodiment of the present invention is not limited to these structures. For example, as illustrated in FIGS. 6A to 6C, the display panel 102 is supported by housings 104, 103, and 106 and flexible base materials 117a, 117b, 118a, and 118b are each placed between adjacent housings so that a semiconductor device 180 can be folded in three.

Figure 6A:
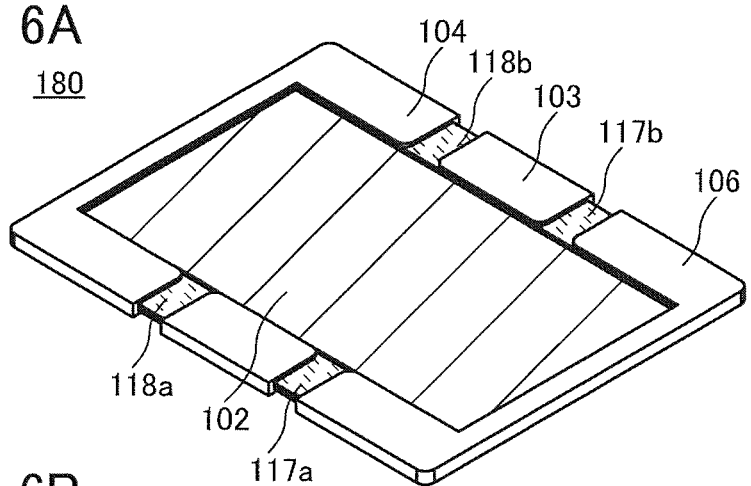
FIGS. 6A to 6C are perspective views of a structure example of a semiconductor device of one embodiment of the present invention.
Figure 6B:
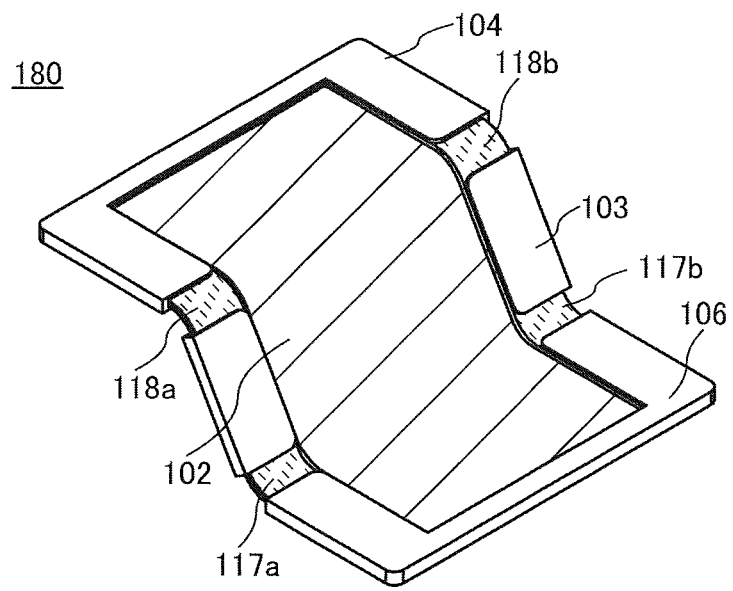
Figure 6C:
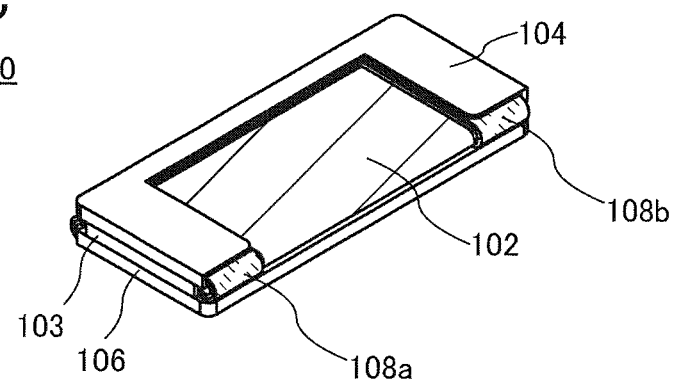

FIG. 6A illustrates the semiconductor device 180 in an open position, and FIG. 6B illustrates the semiconductor device 180 being folded. FIG. 6C illustrates the semiconductor device 180 in a folded position. In the semiconductor device 180, one end of each of the flexible base materials 117a and 117b is firmly attached to one of the housings 106 and 103, and the other end of each of the flexible base materials 117a and 117b slides in a groove portion provided in the other of the housings 106 and 103. In addition, one end of each of the flexible base materials 118a and 118b is firmly attached to one of the housings 103 and 104 and the other end of each of the flexible base materials 118a and 118b slides in a groove portion provided in the other of the housings 103 and 104.

When the number of housings supporting the display panel 102 is n (n is an integer of 2 or more), the semiconductor device can be folded in n. Details are similar to those of the above-described semiconductor device capable of being folded in two.

In the semiconductor device of this embodiment, the flexible base materials are each provided between adjacent housings supporting the flexible display panel and firmly attached to one of the housings and can slide in another of the housings, as described above. Consequently, the semiconductor device is highly portable and reliable and provides improved browsability of display.

Note that the structures and the like in the drawings referred to in this embodiment can each be combined as appropriate with any of the structures and the like in the other drawings.

The structures, methods, and the like described in this embodiment can be combined as appropriate with any of the structures, methods, and the like described in the other embodiments.

Embodiment 2

In this embodiment, an active matrix display panel using an EL element is described as an example of a flexible display panel that can be applied to a semiconductor device of one embodiment of the present invention, with reference to FIGS. 7A and 7B, FIGS. 8A and 8B, FIGS. 9A and 9B, FIGS. 10A and 10B, FIGS. 11A to 11C, and FIGS. 12A to 12C. Note that the display panel is not limited to a display panel including an EL element, and a display panel including a display element such as a liquid crystal element or an electrophoretic element may also be used.

Specific Example 1

Figure 7A:
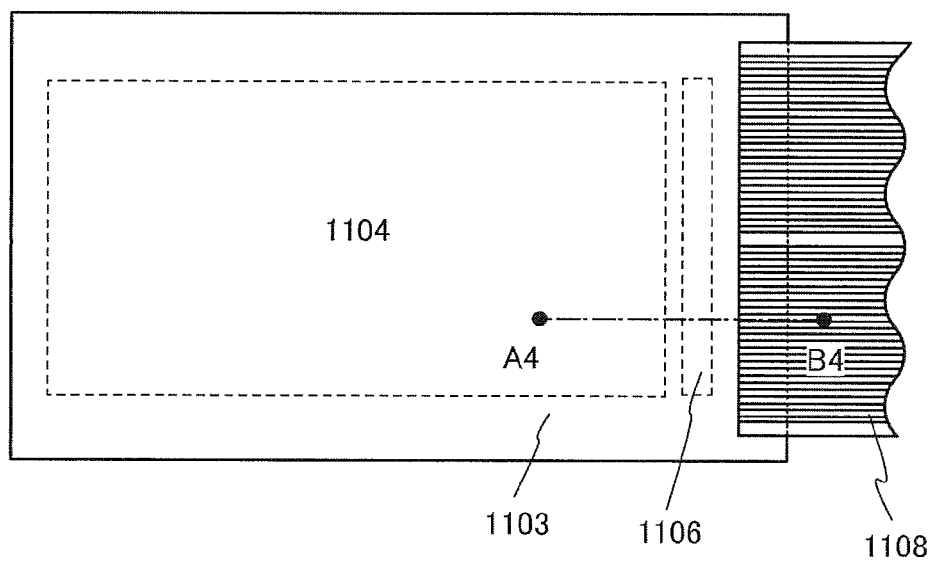
FIGS. 7A and 7B illustrate a structure example of a display panel.
Figure 7B:
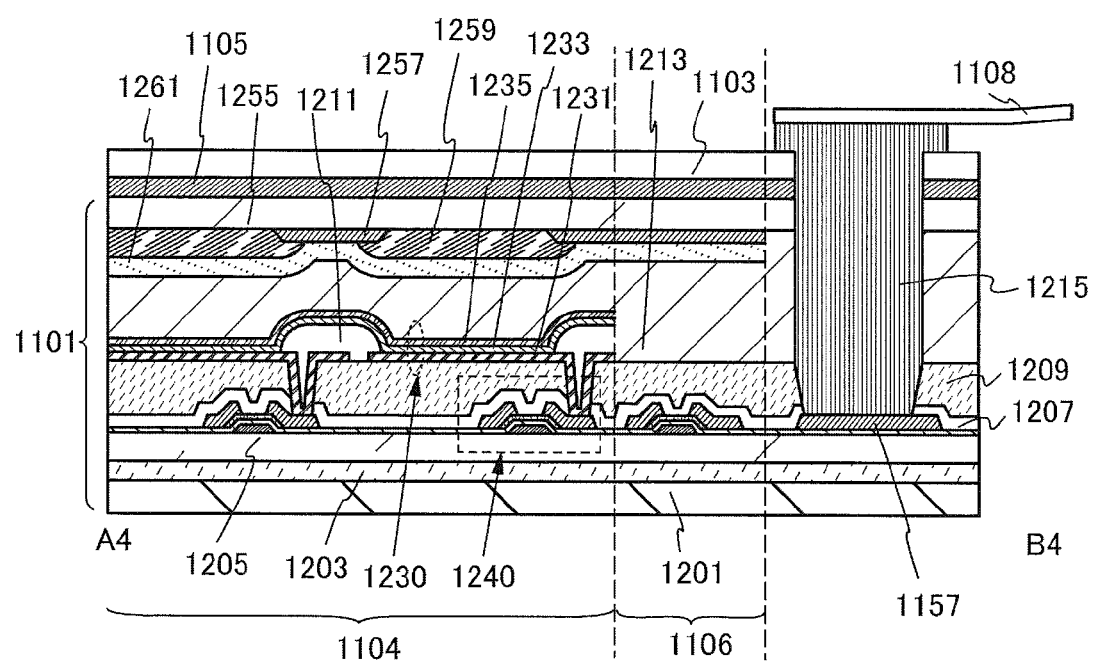

FIG. 7A shows a plan view of a flexible display panel, and FIG. 7B shows an example of a cross-sectional view of FIG. 7A along the dash-dot line A4-B4.

The display panel shown in FIG. 7B includes an element layer 1101, a bonding layer 1105, and a substrate 1103. The element layer 1101 includes a substrate 1201, a bonding layer 1203, an insulating layer 1205, a plurality of transistors 1240, a conductive layer 1157, an insulating layer 1207, an insulating layer 1209, a plurality of light-emitting elements 1230, an insulating layer 1211, a sealing layer 1213, an insulating layer 1261, a coloring layer 1259, a light-blocking layer 1257, and an insulating layer 1255.

The conductive layer 1157 is electrically connected to an FPC 1108 via a connector 1215.

The light-emitting element 1230 includes a lower electrode 1231, an EL layer 1233, and an upper electrode 1235. The EL layer contains an organic light-emitting material. The lower electrode 1231 is electrically connected to a source electrode or a drain electrode of the transistor 1240. An end portion of the lower electrode 1231 is covered with the insulating layer 1211. The light-emitting element 1230 has a top emission structure. The upper electrode 1235 has a light-transmitting property and transmits light emitted from the EL layer 1233.

The coloring layer 1259 is provided to overlap with the light-emitting element 1230, and the light-blocking layer 1257 is provided to overlap with the insulating layer 1211. The coloring layer 1259 and the light-blocking layer 1257 are covered with the insulating layer 1261. The space between the light-emitting element 1230 and the insulating layer 1261 is filled with the sealing layer 1213.

The display panel includes the plurality of transistors in a light extraction portion 1104 and a driver circuit portion 1106. The transistor 1240 is provided over the insulating layer 1205. The insulating layer 1205 and the substrate 1201 are attached to each other with the bonding layer 1203. The insulating layer 1255 and the substrate 1103 are attached to each other with the bonding layer 1105. It is preferable to use films with low water permeability for the insulating layer 1205 and the insulating layer 1255, in which case an impurity such as water can be prevented from entering the light-emitting element 1230 or the transistor 1240, leading to improved reliability of the display panel. The bonding layer 1203 can be formed using a material similar to that of the bonding layer 1105.

The display panel in Specific Example 1 can be manufactured in the following manner: the insulating layer 1205, the transistor 1240, and the light-emitting element 1230 are formed over a formation substrate with high heat resistance; the formation substrate is detached; and the insulating layer 1205, the transistor 1240, and the light-emitting element 1230 are transferred to the substrate 1201 and attached thereto with the use of the bonding layer 1203. Furthermore, the display panel in Specific Example 1 can be manufactured in the following manner: the insulating layer 1255, the coloring layer 1259, and the light-blocking layer 1257 are formed over a formation substrate with high heat resistance; the formation substrate is detached; and the insulating layer 1255, the coloring layer 1259, and the light-blocking layer 1257 are transferred to the substrate 1103 and attached thereto with the use of the bonding layer 1105.

In the case where a material with high water permeability and low heat resistance (e.g., resin) is used for a substrate, a limitation is imposed on the conditions for forming the transistor and the insulating film over the substrate because the substrate cannot be exposed to high temperature in the manufacturing process. In the manufacturing method of this embodiment, the transistor and the like can be formed over a formation substrate with high heat resistance, and consequently a highly reliable transistor and an insulating film with sufficiently low water permeability can be formed. Then, the transistor and the insulating film are transferred to the substrate 1103 and the substrate 1201, whereby a highly reliable display panel can be manufactured. Thus, according to one embodiment of the present invention, a thin or/and lightweight active matrix display panel with high reliability can be provided. Details of the manufacturing method thereof are described later.

The substrate 1103 and the substrate 1201 are each preferably formed using a material with high toughness. Such use enables the display panel to have high impact resistance and to be less likely to be broken. For example, when the substrate 1103 is an organic resin substrate and the substrate 1201 is a substrate formed using a thin metal material or a thin alloy material, the display panel can be lightweight and less likely to be broken, as compared with the case where a glass substrate is used.

A metal material and an alloy material, which have high thermal conductivity, are preferred because they can easily conduct heat to the whole substrate and accordingly can prevent a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

When a material with high thermal emissivity is used for the substrate 1201, the surface temperature of the display panel can be prevented from rising, leading to prevention of breakage or a decrease in reliability of the display panel. For example, the substrate 1201 may have a stacked structure of a metal substrate and a layer with high thermal emissivity (the layer can be formed using a metal oxide or a ceramic material, for example). In the following specific examples, description of components similar to those in Specific Example 1 is omitted.

Specific Example 2

Figure 8A:
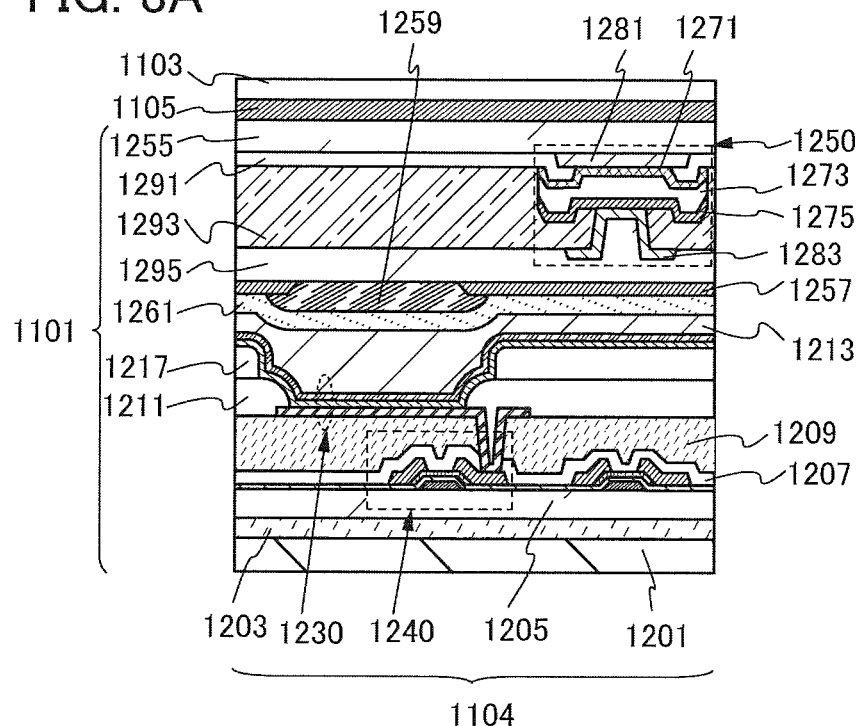
FIGS. 8A and 8B illustrate structure examples of a display panel.

FIG. 8A shows another example of a light extraction portion 1104 in a display panel. The display panel shown in FIG. 8A is capable of touch operation.

The display panel shown in FIG. 8A includes an element layer 1101, a bonding layer 1105, and a substrate 1103. The element layer 1101 includes a substrate 1201, a bonding layer 1203, an insulating layer 1205, a plurality of transistors 1240, an insulating layer 1207, an insulating layer 1209, a plurality of light-emitting elements 1230, an insulating layer 1211, a spacer 1217, a sealing layer 1213, an insulating layer 1261, a coloring layer 1259, a light-blocking layer 1257, a plurality of light-receiving elements 1250, a conductive layer 1281, a conductive layer 1283, an insulating layer 1291, an insulating layer 1293, an insulating layer 1295, and an insulating layer 1255.

In Specific Example 2, the spacer 1217 is provided over the insulating layer 1211. With the provision of the spacer 1217, the space between the substrate 1103 and the substrate 1201 can be adjusted.

FIG. 8A shows an example in which the light-receiving element 1250 is provided between the insulating layer 1255 and the sealing layer 1213. Since the light-receiving element 1250 can be placed to overlap with a non-light-emitting region (e.g., a region where a transistor 1240 or a wire is provided) on the substrate 1201 side, the display panel can be provided with a touch sensor without a decrease in the aperture ratio of a pixel (light-emitting element).

As the light-receiving element 1250 included in the display panel, for example, a PN photodiode or a PIN photodiode can be used. In this embodiment, a PIN photodiode including a p-type semiconductor layer 1271, an i-type semiconductor layer 1273, and an n-type semiconductor layer 1275 is used as the light-receiving element 1250.

Note that the i-type semiconductor layer 1273 is a semiconductor in which the concentration of each of an impurity imparting p-type conductivity and an impurity imparting n-type conductivity is $1\times10^{20}$ cm$^{-3}$ or less and which has photoconductivity 100 times or more as high as dark conductivity. The i-type semiconductor layer 1273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 1273 includes, in its category, a semiconductor to which an impurity element imparting p-type conductivity is added intentionally or unintentionally at the time of deposition or after the deposition.

The light-blocking layer 1257 overlaps with the light-receiving element 1250 on the substrate 1103 side. The light-blocking layer 1257 between the light-receiving element 1250 and the sealing layer 1213 can suppress irradiation of the light-receiving element 1250 with light emitted from the light-emitting element 1230.

Each of the conductive layer 1281 and the conductive layer 1283 is electrically connected to the light-receiving element 1250. For the conductive layer 1281, a conductive layer that transmits light incident on the light-receiving element 1250 is preferably used. For the conductive layer 1283, a conductive layer that blocks light incident on the light-receiving element 1250 is preferably used.

It is preferable to provide an optical touch sensor between the substrate 1103 and the sealing layer 1213 because the optical touch sensor is less likely to be affected by light emitted from the light-emitting element 1230 and can have improved S/N (signal-to-noise) ratio.

Specific Example 3

Figure 8B:
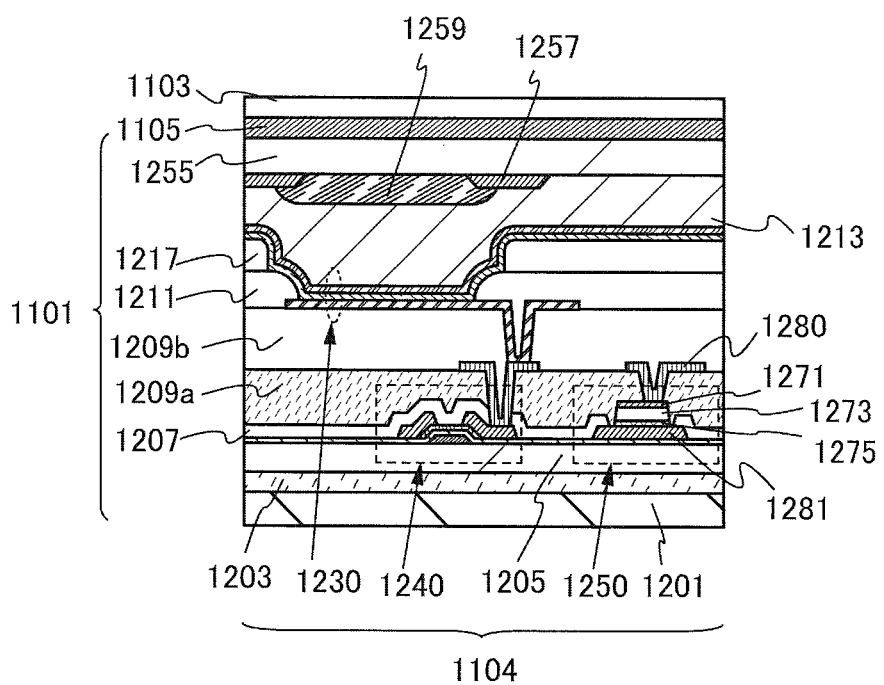

FIG. 8B shows another example of a light extraction portion 1104 in a display panel. The display panel shown in FIG. 8B is capable of touch operation.

The display panel shown in FIG. 8B includes an element layer 1101, a bonding layer 1105, and a substrate 1103. The element layer 1101 includes a substrate 1201, a bonding layer 1203, an insulating layer 1205, a plurality of transistors 1240, an insulating layer 1207, an insulating layer 1209a, an insulating layer 1209b, a plurality of light-emitting elements 1230, an insulating layer 1211, a spacer 1217, a sealing layer 1213, a coloring layer 1259, a light-blocking layer 1257, a plurality of light-receiving elements 1250, a conductive layer 1280, a conductive layer 1281, and an insulating layer 1255.

FIG. 8B shows an example in which a light-receiving element 1250 is provided between the insulating layer 1205 and the sealing layer 1213. Since the light-receiving element 1250 is provided between the insulating layer 1205 and the sealing layer 1213, a conductive layer to which the light-receiving element 1250 is electrically connected and a photoelectric conversion layer included in the light-receiving element 1250 can be formed using the same materials through the same steps as a conductive layer and a semiconductor layer included in a transistor 1240. Thus, the display panel capable of touch operation can be manufactured without a significant increase in the number of manufacturing steps.

Specific Example 4

Figure 9A:
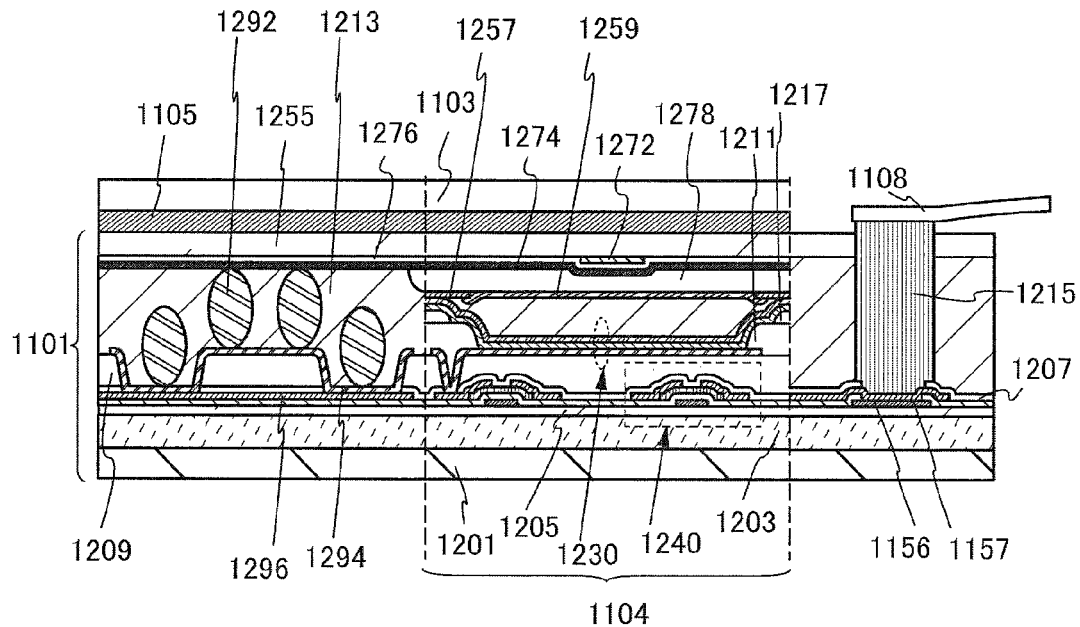
FIGS. 9A and 9B illustrate structure examples of a display panel.

FIG. 9A shows another example of a display panel. The display panel shown in FIG. 9A is capable of touch operation.

The display panel shown in FIG. 9A includes an element layer 1101, a bonding layer 1105, and a substrate 1103. The element layer 1101 includes a substrate 1201, a bonding layer 1203, an insulating layer 1205, a plurality of transistors 1240, a conductive layer 1156, a conductive layer 1157, an insulating layer 1207, an insulating layer 1209, a plurality of light-emitting elements 1230, an insulating layer 1211, a spacer 1217, a sealing layer 1213, a coloring layer 1259, a light-blocking layer 1257, an insulating layer 1255, a conductive layer 1272, a conductive layer 1274, an insulating layer 1276, an insulating layer 1278, a conductive layer 1294, and a conductive layer 1296.

FIG. 9A shows an example in which a capacitive touch sensor is provided between the insulating layer 1255 and the sealing layer 1213. The capacitive touch sensor includes the conductive layer 1272 and the conductive layer 1274.

The conductive layer 1156 and the conductive layer 1157 are electrically connected to an FPC 1108 via a connector 1215. The conductive layer 1294 and the conductive layer 1296 are electrically connected to the conductive layer 1274 via conductive particles 1292. Thus, the capacitive touch sensor can be driven via the FPC 1108.

Specific Example 5

Figure 9B:
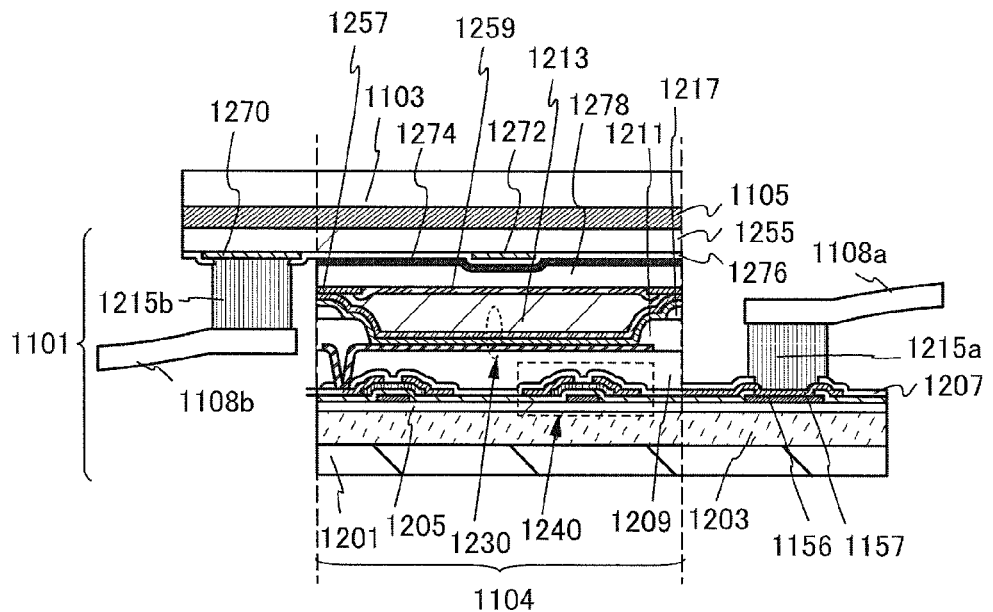

FIG. 9B shows another example of a display panel. The display panel shown in FIG. 9B is capable of touch operation.

The display panel shown in FIG. 9B includes an element layer 1101, a bonding layer 1105, and a substrate 1103. The element layer 1101 includes a substrate 1201, a bonding layer 1203, an insulating layer 1205, a plurality of transistors 1240, a conductive layer 1156, a conductive layer 1157, an insulating layer 1207, an insulating layer 1209, a plurality of light-emitting elements 1230, an insulating layer 1211, a spacer 1217, a sealing layer 1213, a coloring layer 1259, a light-blocking layer 1257, an insulating layer 1255, a conductive layer 1270, a conductive layer 1272, a conductive layer 1274, an insulating layer 1276, and an insulating layer 1278.

FIG. 9B shows an example in which a capacitive touch sensor is provided between the insulating layer 1255 and the sealing layer 1213. The capacitive touch sensor includes the conductive layer 1272 and the conductive layer 1274.

The conductive layer 1156 and the conductive layer 1157 are electrically connected to an FPC 1108a via a connector 1215a. The conductive layer 1270 is electrically connected to an FPC 1108b via a connector 1215b. Thus, a light-emitting element 1230 and a transistor 1240 can be driven via the FPC 1108a, and the capacitive touch sensor can be driven via the FPC 1108b.

Specific Example 6

Figure 10A:
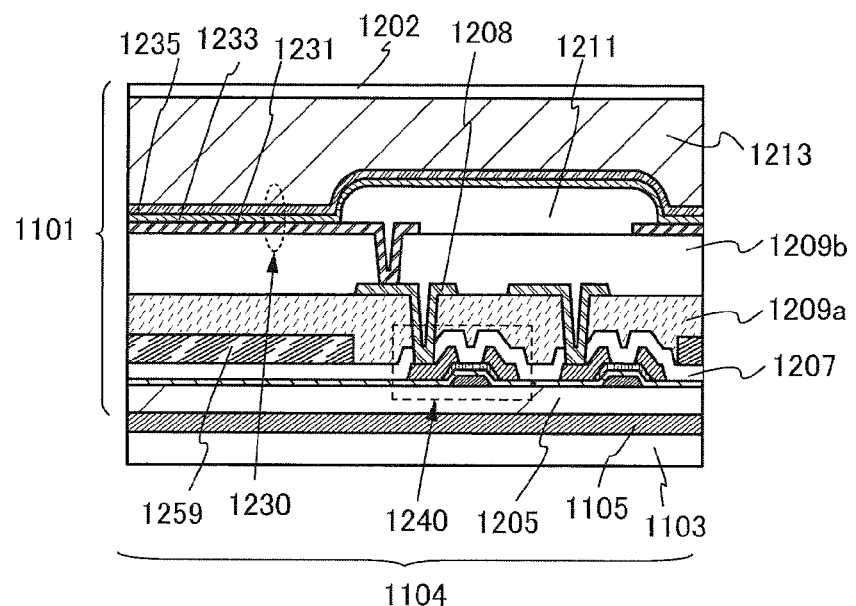
FIGS. 10A and 10B illustrate structure examples of a display panel.

FIG. 10A shows another example of a light extraction portion 1104 in a display panel.

The light extraction portion 1104 in FIG. 10A includes a substrate 1103, a bonding layer 1105, a substrate 1202, an insulating layer 1205, a plurality of transistors 1240, an insulating layer 1207, a conductive layer 1208, an insulating layer 1209a, an insulating layer 1209b, a plurality of light-emitting elements 1230, an insulating layer 1211, a sealing layer 1213, and a coloring layer 1259.

A light-emitting element 1230 includes a lower electrode 1231, an EL layer 1233, and an upper electrode 1235. The lower electrode 1231 is electrically connected to a source electrode or a drain electrode of a transistor 1240 via the conductive layer 1208. An end portion of the lower electrode 1231 is covered with the insulating layer 1211. The light-emitting element 1230 has a bottom emission structure. The lower electrode 1231 has a light-transmitting property and transmits light emitted from the EL layer 1233.

A coloring layer 1259 is provided in a place overlapping with the light-emitting element 1230, and light emitted from the light-emitting element 1230 is extracted from the substrate 1103 side through the coloring layer 1259. The space between the light-emitting element 1230 and the substrate 1202 is filled with the sealing layer 1213. The substrate 1202 can be formed using a material similar to that of the substrate 1201.

Specific Example 7

Figure 10B:
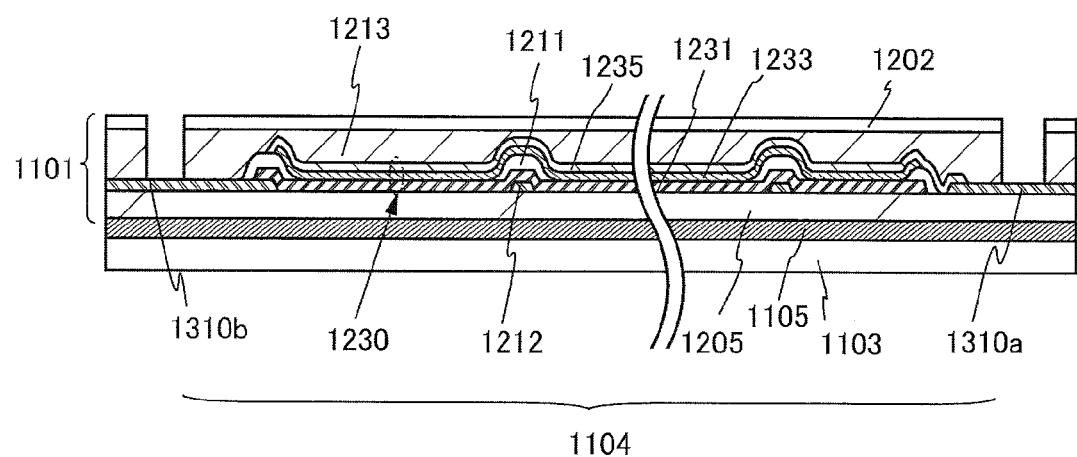

FIG. 10B shows another example of a display panel.

The display panel shown in FIG. 10B includes an element layer 1101, a bonding layer 1105, and a substrate 1103. The element layer 1101 includes a substrate 1202, an insulating layer 1205, a conductive layer 1310a, a conductive layer 1310b, a plurality of light-emitting elements 1230, an insulating layer 1211, a conductive layer 1212, and a sealing layer 1213.

The conductive layer 1310a and the conductive layer 1310b, which are external connection electrodes of the display panel, can each be electrically connected to an FPC or the like.

A light-emitting element 1230 includes a lower electrode 1231, an EL layer 1233, and an upper electrode 1235. An end portion of the lower electrode 1231 is covered with the insulating layer 1211. The light-emitting element 1230 has a bottom emission structure. The lower electrode 1231 has a light-transmitting property and transmits light emitted from the EL layer 1233. The conductive layer 1212 is electrically connected to the lower electrode 1231.

The substrate 1103 may have, as a light extraction structure, a hemispherical lens, a micro lens array, a film provided with an uneven surface structure, a light diffusing film, or the like. For example, the substrate 1103 with a light extraction structure can be formed by bonding the above lens or film to a resin substrate with an adhesive or the like having substantially the same refractive index as the substrate or the lens or film.

The conductive layer 1212 is preferably, though not necessarily, provided because voltage drop due to the resistance of the lower electrode 1231 can be inhibited. In addition, for a similar purpose, a conductive layer electrically connected to the upper electrode 1235 may be provided over the insulating layer 1211.

The conductive layer 1212 can be a single layer or a stacked layer formed using a material selected from copper, titanium, tantalum, tungsten, molybdenum, chromium, neodymium, scandium, nickel, or aluminum, or an alloy material containing any of these materials as its main component. The thickness of the conductive layer 1212 can be greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 1235, metal particles forming the conductive layer aggregate. Consequently, the surface of the conductive layer is rough and has many gaps, so that the conductive layer is difficult to completely cover with the EL layer 1233. Thus, the upper electrode and an auxiliary wire are electrically connected to each other easily, which is preferable.

<Examples of Materials>

Next, materials and the like that can be used for a display panel of one embodiment of the present invention are described. Note that description on the components already described in this embodiment will be omitted.

The element layer 1101 includes at least a display element. When a light-emitting element is used as the display element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1101 may further include a transistor for driving the display element, a touch sensor, or the like.

The structure of the transistors in the display panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the display panel includes a pair of electrodes (the lower electrode 1231 and the upper electrode 1235); and the EL layer 1233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to transmit light. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an ink-jet method, a printing method such as a screen printing method, or a plating method can be used.

When a voltage higher than the threshold voltage of the light-emitting element is applied between the lower electrode 1231 and the upper electrode 1235, holes are injected to the EL layer 1233 from the anode side and electrons are injected to the EL layer 1233 from the cathode side. The injected electrons and holes are recombined in the EL layer 1233 and a light-emitting substance contained in the EL layer 1233 emits light.

The EL layer 1233 includes at least a light-emitting layer. In addition to the light-emitting layer, the EL layer 1233 may further include one or more layers containing any of a material with a high hole-injection property, a material with a high hole-transport property, a material with a high hole-blocking property, a material with a high electron-transport property, a material with a high electron-injection property, a material with a bipolar property (a material with a high electron- and hole-transport property), and the like.

For the EL layer 1233, either a low molecular compound or a high molecular compound can be used, and an inorganic compound may also be contained. Each of the above-described layers included in the EL layer 1233 can be formed by any of the following methods: an evaporation method (including a vacuum evaporation method), a transfer method, a printing method, an inkjet method, a coating method, and the like.

In the element layer 1101, the light-emitting element is preferably provided between a pair of insulating films with low water permeability. In this case, entry of an impurity such as water to the light-emitting element can be suppressed, and a decrease in the reliability of the light-emitting device can be suppressed.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ g/m$^2$·day, preferably lower than or equal to $1\times10^{-6}$ g/m$^2$·day, further preferably lower than or equal to $1\times10^{-7}$ g/m$^2$·day, still further preferably lower than or equal to $1\times10^{-8}$ g/m$^2$·day.

The substrate 1103 has a light-transmitting property and transmits at least light emitted from the light-emitting element included in the element layer 1101. The substrate 1103 may be a flexible substrate. As the substrate 1103, a substrate having a higher refractive index than the air is used. A substrate using an organic resin, which is lighter than glass, is preferably used for the substrate 1103, in which case the semiconductor device can be lightweight as compared with the case where glass is used.

Examples of a material that are flexible and transmits visible light include a glass material that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1103 may have a stacked structure in which a hard coat layer (such as a silicon nitride layer) by which a surface of the display panel is protected from damage or the like, a layer (such as an aramid resin layer) which can disperse pressure, or the like is stacked over a layer of any of the above-mentioned materials. Furthermore, to suppress a decrease in the lifetime of the light-emitting element due to moisture and the like, the insulating film with low water permeability may be included.

The bonding layer 1105 has a light-transmitting property and transmits at least light emitted from the light-emitting element included in the element layer 1101. The refractive index of the bonding layer 1105 is higher than that of the air.

For the bonding layer 1105, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferred.

Further, the resin may include a drying agent. For example, a substance which absorbs moisture by chemical adsorption, such as an oxide of an alkaline-earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 1105 may also include a scattering member for scattering light. For example, the bonding layer 1105 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 1205 and the insulating layer 1255 can each be formed using an inorganic insulating material. It is particularly preferable to use the insulating film with low water permeability, in which case a highly reliable display panel can be provided.

The insulating layer 1207 has an effect of preventing diffusion of impurities into a semiconductor included in the transistor. As the insulating layers 1207, an inorganic insulating film such as a silicon oxide film, a silicon oxynitride film, or an aluminum oxide film can be used.

As each of the insulating layers 1209, 1209a, and 1209b, an insulating film with a planarization function is preferably selected in order to reduce surface unevenness due to the transistor or the like. For example, an organic material such as a polyimide resin, an acrylic resin, or a benzocyclobutene-based resin can be used. As an alternative to such an organic material, a low-dielectric constant material (a low-k material) or the like can be used. Note that a plurality of insulating films formed of these materials or inorganic insulating films may be stacked.

The insulating layer 1211 is provided to cover an end portion of the lower electrode 1231. In order that the insulating layer 1211 be favorably covered with the EL layer 1233 and the upper electrode 1235 formed thereover, a side wall of the insulating layer 1211 preferably has a tilted surface with continuous curvature.

As a material for the insulating layer 1211, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1211.

There is no particular limitation on the method of forming the insulating layer 1211; a photolithography method, a sputtering method, an evaporation method, a droplet discharging method (e.g., an inkjet method), a printing method (e.g., a screen printing method or an off-set printing method), or the like can be used.

The spacer 1217 can be formed using an inorganic insulating material, an organic insulating material, a metal material, or the like. As the organic insulating material, for example, a negative or positive photosensitive resin, a non-photosensitive resin, or the like can be used. As the metal material, titanium, aluminum, or the like can be used. When a conductive material is used for the spacer 1217 and the spacer 1217 is electrically connected to the upper electrode 1235, voltage drop due to the resistance of the upper electrode 1235 can be prevented. The spacer 1217 may have either a tapered shape or an inverse tapered shape.

Each of the insulating layers 1276, 1278, 1291, 1293, and 1295 can be formed using an inorganic insulating material or an organic insulating material. It is particularly preferable to use an insulating film with a planarization function for each of the insulating layers 1278 and 1295 in order to reduce surface unevenness due to a sensor element.

For the sealing layer 1213, a resin that is curable at room temperature such as a two-component type resin, a light-curable resin, a heat-curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 1213. In the case where light emitted from the light-emitting element 1230 is extracted outside through the sealing layer 1213, the sealing layer 1213 preferably includes a filler with a high refractive index or a scattering member. Materials for the drying agent, the filler with a high refractive index, and the scattering member are similar to those that can be used for the bonding layer 1105.

Each of the conductive layers 1156, 1157, 1294, and 1296 can be formed using the same material and the same step as a conductive layer included in the transistor or the light-emitting element. The conductive layer 1280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 1208, 1212, 1283, 1310a, and 1310b can also be formed using any of the above metal materials, alloy materials, and conductive metal oxides.

Each of the conductive layers 1272, 1274, and 1281 is a conductive layer that transmits light. Each of them can be formed using, for example, indium oxide, ITO, indium zinc oxide, zinc oxide, zinc oxide to which gallium is added, or the like. The conductive layer 1270 can be formed using the same material and the same step as the conductive layer 1272.

As the conductive particles 1292, particles of an organic resin, silica, or the like coated with a metal material are used. It is preferable to use nickel or gold as the metal material because contact resistance can be decreased. It is also preferable to use particles each coated with layers of two or more kinds of metal materials, such as particles coated with nickel and further with gold.

For the connector 1215, it is possible to use a paste-like or sheet-like material in which a thermosetting resin is mixed with metal particles and which exhibits anisotropic electric conductivity is provided by thermocompression bonding. As the metal particles, particles in which two or more kinds of metals are layered, for example, nickel particles coated with gold are preferably used.

The coloring layer 1259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1257 is provided between the adjacent coloring layers 1259. The light-blocking layer 1257 blocks light emitted from the adjacent light-emitting element, thereby preventing color mixture between adjacent pixels. Here, the coloring layer 1259 is provided such that its end portion overlaps with the light-blocking layer 1257, whereby light leakage can be reduced. The light-blocking layer 1257 can be formed using a material that blocks light emitted from the light-emitting element, for example, a metal material, a resin material including a pigment or a dye, or the like. Note that the light-blocking layer 1257 is preferably provided in a region other than the light extraction portion 1104, such as the driver circuit portion 1106, as illustrated in FIG. 7A, in which case undesired leakage of guided light or the like can be prevented.

The insulating layer 1261 covering the coloring layer 1259 and the light-blocking layer 1257 is preferably provided because it can prevent an impurity such as a pigment included in the coloring layer 1259 or the light-blocking layer 1257 from diffusing into the light-emitting element or the like. For the insulating layer 1261, a light-transmitting material is used, and an inorganic insulating material or an organic insulating material can be used. The insulating film with low water permeability may be used for the insulating layer 1261.

<Method of Manufacturing Display Panel>

An example of a method of manufacturing a display panel is described with reference to FIGS. 11A to 11C and FIGS. 12A to 12C. Here, the manufacturing method is described using the display panel of Specific Example 1 (FIG. 7B) as an example.

Figure 11A:
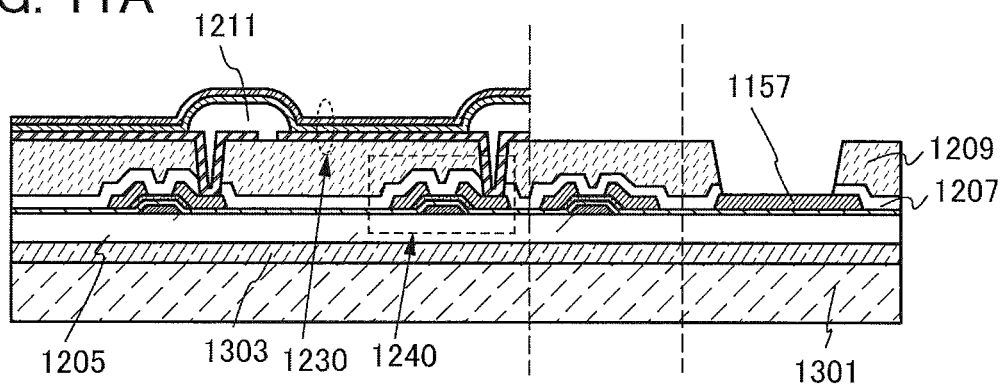
FIGS. 11A to 11C illustrate one embodiment of a method of manufacturing a display panel.

First, a separation layer 1303 is formed over a formation substrate 1301, and the insulating layer 1205 is formed over the separation layer 1303. Then, the plurality of transistors 1240, the conductive layer 1157, the insulating layer 1207, the insulating layer 1209, the plurality of light-emitting elements 1230, and the insulating layer 1211 are formed over the insulating layer 1205. An opening is formed in the insulating layers 1211, 1209, and 1207 to expose the conductive layer 1157 (FIG. 11A).

Figure 11B:
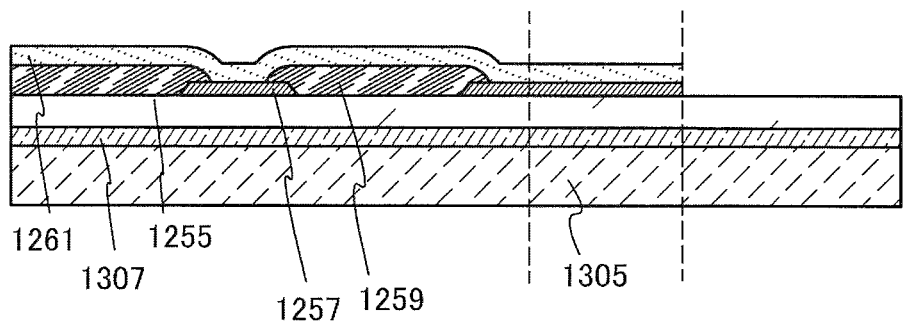

A separation layer 1307 is formed over a formation substrate 1305, and the insulating layer 1255 is formed over the separation layer 1307. Then, the light-blocking layer 1257, the coloring layer 1259, and the insulating layer 1261 are formed over the insulating layer 1255 (FIG. 11B).

The formation substrate 1301 and the formation substrate 1305 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. In the case where the temperature of heat treatment to be performed later is high, a substrate having a strain point of 730° C. or higher is preferably used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 1303 and the separation layer 1307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be any of amorphous, microcrystal, and polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Each of the insulating layers can be formed by a sputtering method, a plasma CVD method, a coating method, a printing method, or the like. For example, the insulating layer is formed at a temperature greater than or equal to 250° C. and less than or equal to 400° C. by a plasma CVD method, whereby the insulating layer can be a dense film with very low water permeability.

Figure 11C:
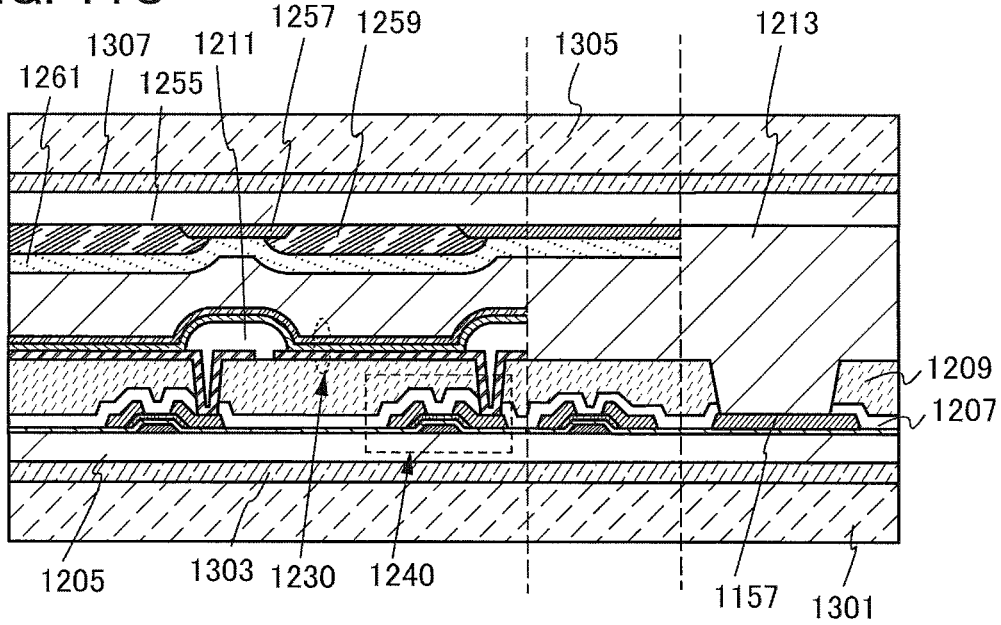

Then, a material for the sealing layer 1213 is applied to a surface of the formation substrate 1305 over which the coloring layer 1259 and the like are formed or a surface of the formation substrate 1301 over which the light-emitting element 1230 and the like are formed, and the formation substrate 1301 and the formation substrate 1305 are attached so that these two surfaces face each other with the sealing layer 1213 positioned therebetween (FIG. 11C).

Next, the formation substrate 1301 is separated, and the exposed insulating layer 1205 and the substrate 1201 are attached to each other with the use of the bonding layer 1203. Furthermore, the formation substrate 1305 is separated, and the exposed insulating layer 1255 and the substrate 1103 are attached to each other with the use of the bonding layer 1105. Although the substrate 1103 does not overlap with the conductive layer 1157 in FIG. 12A, the substrate 1103 may overlap with the conductive layer 1157.

Any of a variety of methods can be used as appropriate for the separation process. For example, when a layer including a metal oxide film is formed as the separation layer so as to be in contact with the layer to be separated, the metal oxide film is embrittled by crystallization, whereby the layer to be separated can be separated from the formation substrate. Alternatively, when an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film in contact with the layer to be separated is formed, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Alternatively, a method carried out as follows may be employed: a film containing nitrogen, oxygen, hydrogen, or the like (e.g., an amorphous silicon film containing hydrogen, an alloy film containing hydrogen, an alloy film containing oxygen, or the like) is used as the separation layer, and the separation layer is irradiated with laser light to release nitrogen, oxygen, or hydrogen contained in the separation layer as gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods is combined, the separation process can be conducted easily. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by soaking the interface between the separation layer and the layer to be separated in a liquid. Furthermore, the separation may be conducted while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at an interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 12A:
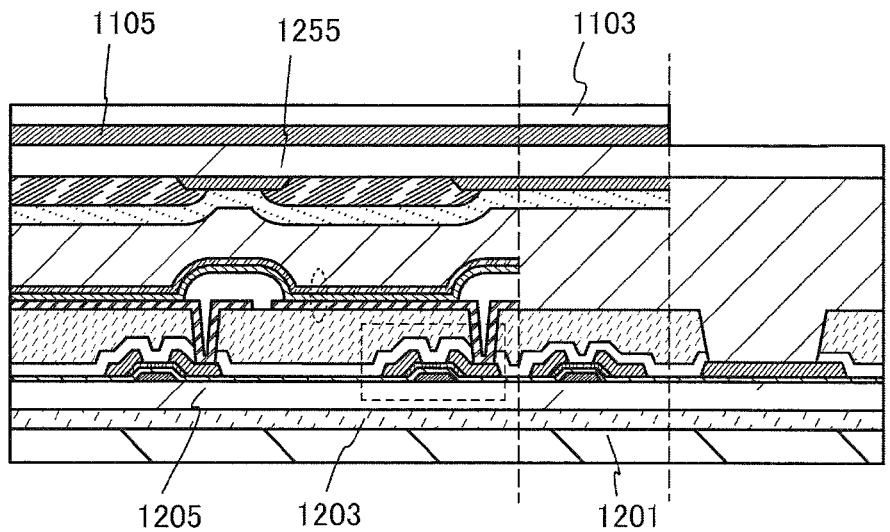
FIGS. 12A to 12C illustrate one embodiment of the method of manufacturing a display panel.
Figure 12B:
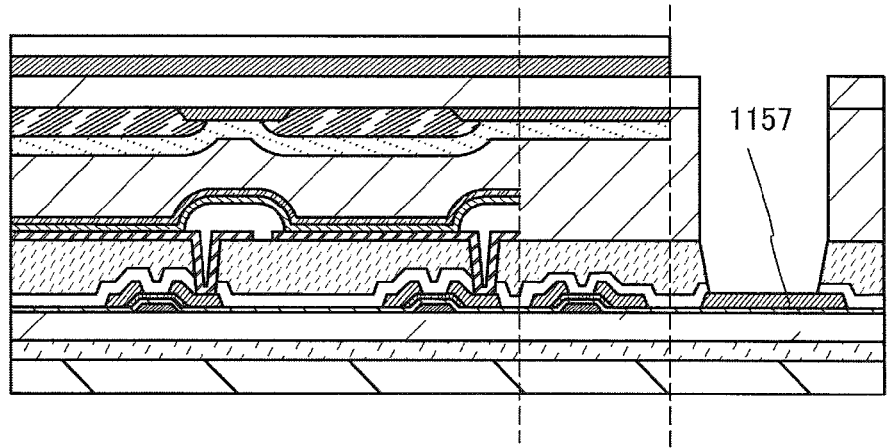
Figure 12C:
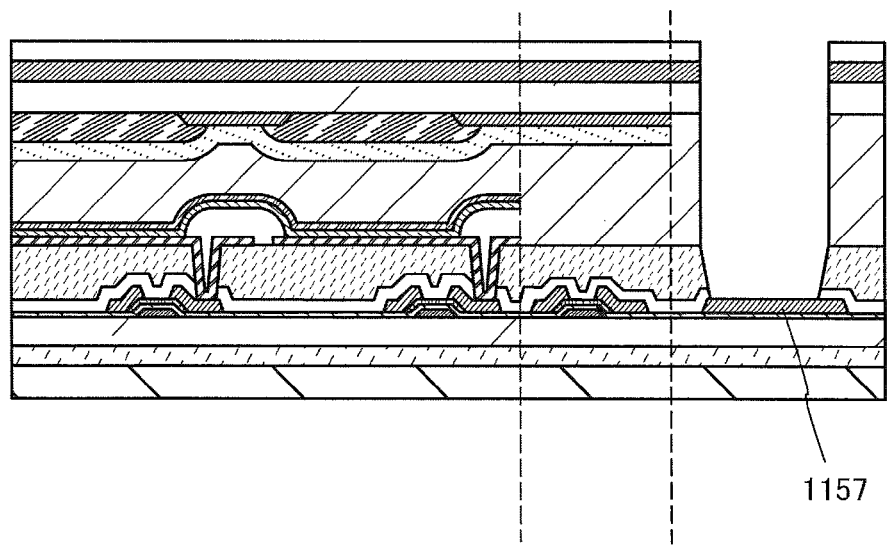

Lastly, an opening is formed in the insulating layer 1255 and the sealing layer 1213 to expose the conductive layer 1157 (FIG. 12B). In the case where the substrate 1103 overlaps with the conductive layer 1157, the opening is formed also in the substrate 1103 and the bonding layer 1105 (FIG. 12C). The method of forming the opening is not particularly limited and may be, for example, a laser ablation method, an etching method, an ion beam sputtering method, or the like. As another method, a cut may be made in a film over the conductive layer 1157 with a sharp knife or the like and part of the film may be separated by physical force.

In the above-described manner, the display panel can be manufactured.

The display panel of this embodiment includes two substrates; one is the substrate 1103 and the other is the substrate 1201 or the substrate 1202. The display panel can be formed with two substrates even when including a touch sensor. Owing to the use of the minimum number of substrates, improvement in light extraction efficiency and improvement in clarity of display can be easily achieved.

The structures, methods, and the like described in this embodiment can be combined as appropriate with any of the structures, methods, and the like described in the other embodiments.

Embodiment 3

In this embodiment, examples of an electronic device using the display device of one embodiment of the present invention are described with reference to drawings.

Examples of electronic devices using a flexible display device are television devices (also called televisions or television receivers), monitors of computers or the like, digital cameras, digital video cameras, digital photo frames, mobile phones (also called cellular phones or mobile phone devices), portable game machines, portable information terminals, audio reproducing devices, large game machines, and the like.

Figure 13A:
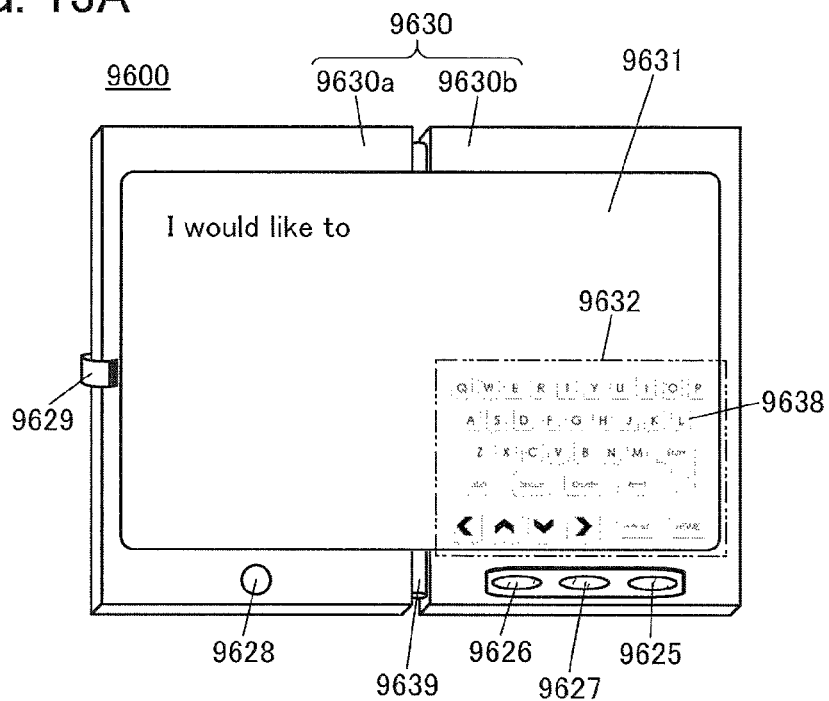
FIGS. 13A to 13C illustrate examples of electronic devices.
Figure 13B:
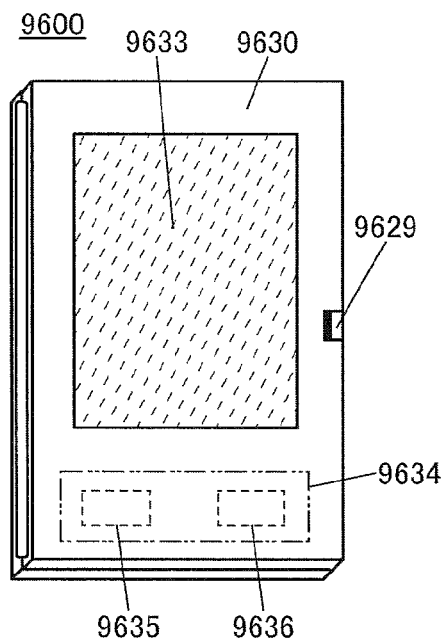

FIGS. 13A and 13B illustrate a tablet terminal 9600 which can be folded in two. Note that, although an example in which the tablet terminal can be folded in two is shown here, a tablet terminal that can be folded in three, four, or more can also be fabricated. In FIG. 13A, the tablet terminal 9600 is opened, and includes a housing 9630, a display portion 9631, a switch 9626 for switching display modes, a power switch 9627, a switch 9625 for switching to power-saving mode, a fastener 9629, and an operation switch 9628.

The housing 9630 includes a housing 9630a and a housing 9630b, which are connected to each other with a flexible base material 9639. The housing 9630 can be folded in two owing to the flexible base material 9639.

The display portion 9631 is formed with a flexible display panel supported by the housings 9630a and 9630b. As the flexible display panel, the display panel described in the above embodiments can be used. The flexible base material 9639 placed to have a curved surface on the outside of a curved portion of the display panel can reduce a load on this curved portion in a deformation into a folded position, reducing damage such as a crack to the region. Consequently, a highly reliable tablet terminal can be provided.

Part of the display portion 9631 can be a touch sensor region 9632 and data can be input when a displayed operation key panel 9638 is touched. The display portion 9631 may have a structure in which a half of the area has only a display function and the other half of the area has a touch sensor function. Alternatively, all the area of the display portion 9631 may have a touch sensor function. For example, keyboard buttons may be displayed on all the area of the display portion 9631 so that the tablet terminal is used as a data input terminal.

The switch 9626 for switching a display mode allows switching between a landscape mode and a portrait mode, switching between color display and black-and-white display, and the like. The switch 9625 for switching to power-saving mode can control display luminance to be optimal in accordance with the amount of external light in use of the tablet terminal which is detected by an optical sensor incorporated in the tablet terminal. In addition to the optical sensor, other sensing devices such as sensors for detecting inclination, such as a gyroscope or an acceleration sensor, may be incorporated in the tablet terminal.

In FIG. 13B, the tablet terminal 9600 is folded, and includes the housing 9630, a solar battery 9633, and a charge and discharge control circuit 9634. Note that FIG. 13B shows an example in which the charge and discharge control circuit 9634 includes a battery 9635 and a DCDC converter 9636.

With the use of the display panel described in the above embodiments for the display portion 9631, the display portion 9631 becomes foldable. For example, since the tablet terminal 9600 can be folded in two, the housing 9630 can be closed when the tablet terminal is not used. Therefore, the tablet terminal is excellent in portability, and excellent in durability since the display portion 9631 can be protected when the housing 9630 is closed; accordingly, the tablet terminal is excellent in reliability in the light of long-term use.

The tablet terminal illustrated in FIGS. 13A and 13B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached on the surface of the tablet terminal, can supply electric power to the touch panel, the display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 13C:
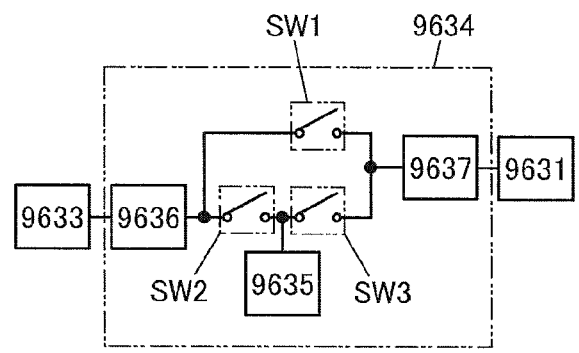

The structure and operation of the charge and discharge control circuit 9634 illustrated in FIG. 13B are described with reference to a block diagram of FIG. 13C. FIG. 13C shows the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 13B.

First, an example of operation in the case where power is generated by the solar battery 9633 using external light is described. The voltage of power generated by the solar cell is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

It is needless to say that one embodiment of the present invention is not limited to the above-described electronic devices as long as the display device of one embodiment of the present invention is incorporated.

The structures, methods, and the like described in this embodiment can be combined as appropriate with any of the structures, methods, and the like described in the other embodiments.

This application is based on Japanese Patent Application serial no. 2013-263533 filed with the Japan Patent Office on Dec. 20, 2013, the entire contents of which are hereby incorporated by reference.

What is claimed is:
1. A display device comprising:
a flexible display panel;
a first housing that supports a first region of the flexible display panel;
a second housing that supports a second region of the flexible display panel;
a first flexible base material that connects the first housing to the second housing;
a first elastic body attaching the flexible display panel to the first housing; and a second elastic body attaching the flexible display panel to the second housing, wherein the display device is configured to be deformed between an opening position and a folded position, wherein the flexible display panel is flat in the opening position, and wherein parts of the flexible display panel overlap with each other in the folded position.

2. The display device according to claim 1, wherein the flexible display panel comprises a light-emitting element.

3. The display device according to claim 1, wherein the flexible display panel comprises a touch sensor.

4. The display device according to claim 1, wherein the flexible display panel comprises a light-receiving element.

5. The display device according to claim 1,
wherein the flexible display panel comprises:
a transistor;
an insulating film over the transistor;
a light-emitting element over the insulating film and electrically connected to the transistor; and
a color filter overlapping with the light-emitting element.

6. The display device according to claim 5, wherein the color filter is positioned between the insulating film and the light-emitting element.

7. The display device according to claim 5, wherein the color filter is positioned over the light-emitting element.

8. An electronic device comprising:
the display device according to claim 1; and
a battery electrically connected to the flexible display panel.

9. The electronic device according to claim 8, wherein the flexible display panel comprises a light-emitting element.

10. The electronic device according to claim 8, wherein the flexible display panel comprises a touch sensor.

11. The electronic device according to claim 8, wherein the flexible display panel comprises a light-receiving element.

12. The electronic device according to claim 8,
wherein the flexible display panel comprises:
a transistor;
an insulating film over the transistor;
a light-emitting element over the insulating film and electrically connected to the transistor; and
a color filter overlapping with the light-emitting element.

13. The electronic device according to claim 12, wherein the color filter is positioned between the insulating film and the light-emitting element.

14. The electronic device according to claim 12, wherein the color filter is positioned over the light-emitting element.

15. The electronic device according to claim 8, comprising a solar battery on a back surface of the first housing and electrically connected to the battery via a DCDC converter.

16. The electronic device according to claim 8, wherein the first housing is provided with a fastener.

17. The display device according to claim 1, wherein the first elastic body and the second elastic body are each any of a spring, a rubber, and an organic resin.

18. The electronic device according to claim 8, wherein the first elastic body and the second elastic body are each any of a spring, a rubber, and an organic resin.

19. A display device comprising:
a flexible display panel;
a first housing that supports a first region of the flexible display panel;
a second housing that supports a second region of the flexible display panel;
a first flexible base material that connects the first housing to the second housing; and
an elastic body attaching the flexible display panel to at least any one of the first housing and the second housing;
wherein the display device is configured to be deformed between an opening position and a folded position,
wherein the flexible display panel is flat in the opening position, and
wherein parts of the flexible display panel overlap with each other in the folded position.

20. The display device according to claim 19, wherein the flexible display panel comprises a light-emitting element.

21. The display device according to claim 19, wherein the flexible display panel comprises a touch sensor.

22. The display device according to claim 19, wherein the flexible display panel comprises a light-receiving element.

23. The display device according to claim 19, wherein the elastic body is any of a spring, a rubber, and an organic resin.

24. The display device according to claim 19,
wherein the flexible display panel comprises:
a transistor;
an insulating film over the transistor;
a light-emitting element over the insulating film and electrically connected to the transistor; and
a color filter overlapping with the light-emitting element.

25. The display device according to claim 24, wherein the color filter is positioned between the insulating film and the light-emitting element.

26. The display device according to claim 24, wherein the color filter is positioned over the light-emitting element.

27. An electronic device comprising:
the display device according to claim 19; and
a battery electrically connected to the flexible display panel.

28. The electronic device according to claim 27, comprising a solar battery on a back surface of the first housing and electrically connected to the battery via a DCDC converter.

29. The electronic device according to claim 27, wherein the first housing is provided with a fastener.

30. A display device comprising:
a flexible display panel;
a first housing that supports a first region of the flexible display panel;
a second housing that supports a second region of the flexible display panel;
a first flexible base material that connects the first housing to the second housing; and
an elastic body attaching the first flexible base material to at least any one of the first housing and the second housing,
wherein the display device is configured to be deformed between an opening position and a folded position,
wherein the flexible display panel is flat in the opening position, and
wherein parts of the flexible display panel overlap with each other in the folded position.

31. The display device according to claim 30, comprising a second flexible base material that connects the first housing to the second housing, wherein the flexible display panel is positioned between the first flexible base material and the second flexible base material.

32. The display device according to claim 30, wherein the flexible display panel comprises a light-emitting element.

33. The display device according to claim 30, wherein the flexible display panel comprises a touch sensor.

34. The display device according to claim 30, wherein the flexible display panel comprises a light-receiving element.

35. The display device according to claim 30,
wherein the flexible display panel comprises:
   a transistor;
   an insulating film over the transistor;
   a light-emitting element over the insulating film and electrically connected to the transistor; and
   a color filter overlapping with the light-emitting element.

36. The display device according to claim 35, wherein the color filter is positioned between the insulating film and the light-emitting element.

37. The display device according to claim 35, wherein the color filter is positioned over the light-emitting element.

38. An electronic device comprising:
   the display device according to claim 35; and
   a battery electrically connected to the flexible display panel.

39. The electronic device according to claim 38, comprising a solar battery on a back surface of the first housing and electrically connected to the battery via a DCDC converter.

40. The electronic device according to claim 38, wherein the first housing is provided with a fastener.

\* \* \* \* \*